(12) United States Patent
Heo et al.

(10) Patent No.: US 8,912,103 B2
(45) Date of Patent: Dec. 16, 2014

(54) METHOD OF FABRICATING AND CORRECTING NANOIMPRINT LITHOGRAPHY TEMPLATES

(71) Applicant: Samsung Electronics Co., Ltd., Suwon-si (KR)

(72) Inventors: Jin-Seok Heo, Suwon-si (KR); Jeong-Ho Yeo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 135 days.

(21) Appl. No.: 13/681,468

(22) Filed: Nov. 20, 2012

(65) Prior Publication Data

US 2013/0267095 A1    Oct. 10, 2013

(30) Foreign Application Priority Data

Apr. 5, 2012    (KR) .................. 10-2012-0035549

(51) Int. Cl.
*H01L 21/00*    (2006.01)
*H01L 21/308*    (2006.01)
*H01L 21/027*    (2006.01)
*B82Y 10/00*    (2011.01)
*G03F 7/00*    (2006.01)

(52) U.S. Cl.
CPC ........ *H01L 21/3086* (2013.01); *H01L 21/0271* (2013.01); *B82Y 10/00* (2013.01); *H01L 21/0273* (2013.01); *G03F 7/0002* (2013.01); *Y10S 438/942* (2013.01)
USPC .................... 438/795; 438/942; 257/E21.328

(58) Field of Classification Search
USPC .................................. 257/E21.317, E21.487
See application file for complete search history.

(56) References Cited

U.S. PATENT DOCUMENTS

| 7,827,520 B2 | 11/2010 | Choi |
| 2002/0000524 A1* | 1/2002 | Suzuki et al. ............. 250/492.21 |
| 2008/0143987 A1* | 6/2008 | Uemura .......................... 355/67 |
| 2010/0003830 A1 | 1/2010 | Itoh |
| 2010/0081093 A1* | 4/2010 | Kasa et al. ..................... 430/319 |
| 2010/0304280 A1 | 12/2010 | Hatano |
| 2012/0091370 A1 | 4/2012 | Itoh |

FOREIGN PATENT DOCUMENTS

| JP | 2009-170458 | 7/2009 |
| JP | 2010-278041 | 12/2010 |
| KR | 100826655 B1 | 4/2008 |

OTHER PUBLICATIONS

Korean Trademark Publication No. 40-2005-0056230 Published Oct. 5, 2005.

* cited by examiner

*Primary Examiner* — Cheung Lee
(74) *Attorney, Agent, or Firm* — Volentine & Whitt, PLLC

(57) ABSTRACT

A method of fabricating a nanoimprint lithography template includes installing a reticle on a reticle stage of scanning lithography equipment having a light source, the reticle stage and a template stage, mounting a template substrate on the template stage, and scanning the template substrate with light from the light source in an exposure process in which the light passes through the reticle and impinges the template substrate at an oblique angle of incidence.

15 Claims, 26 Drawing Sheets

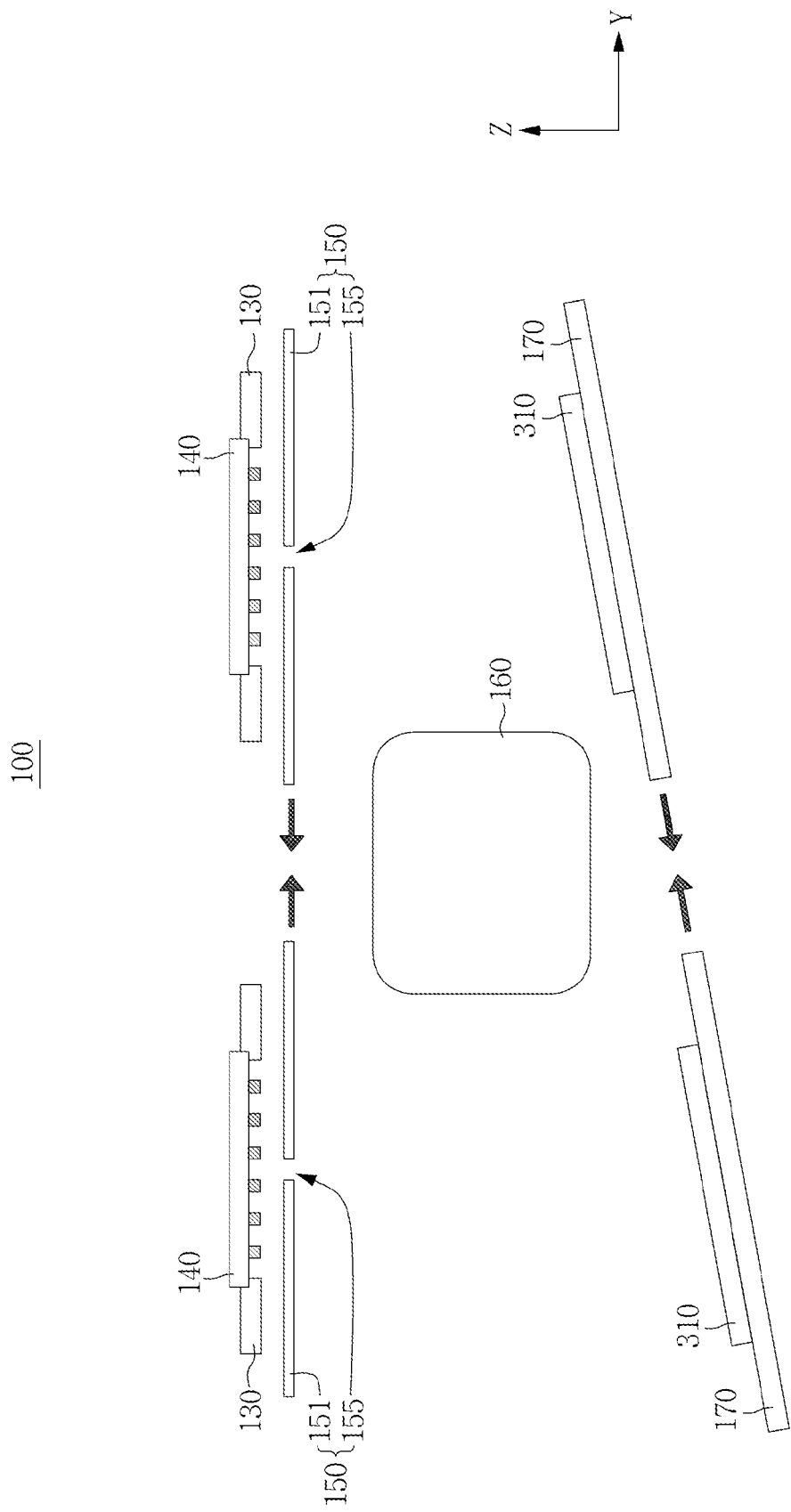

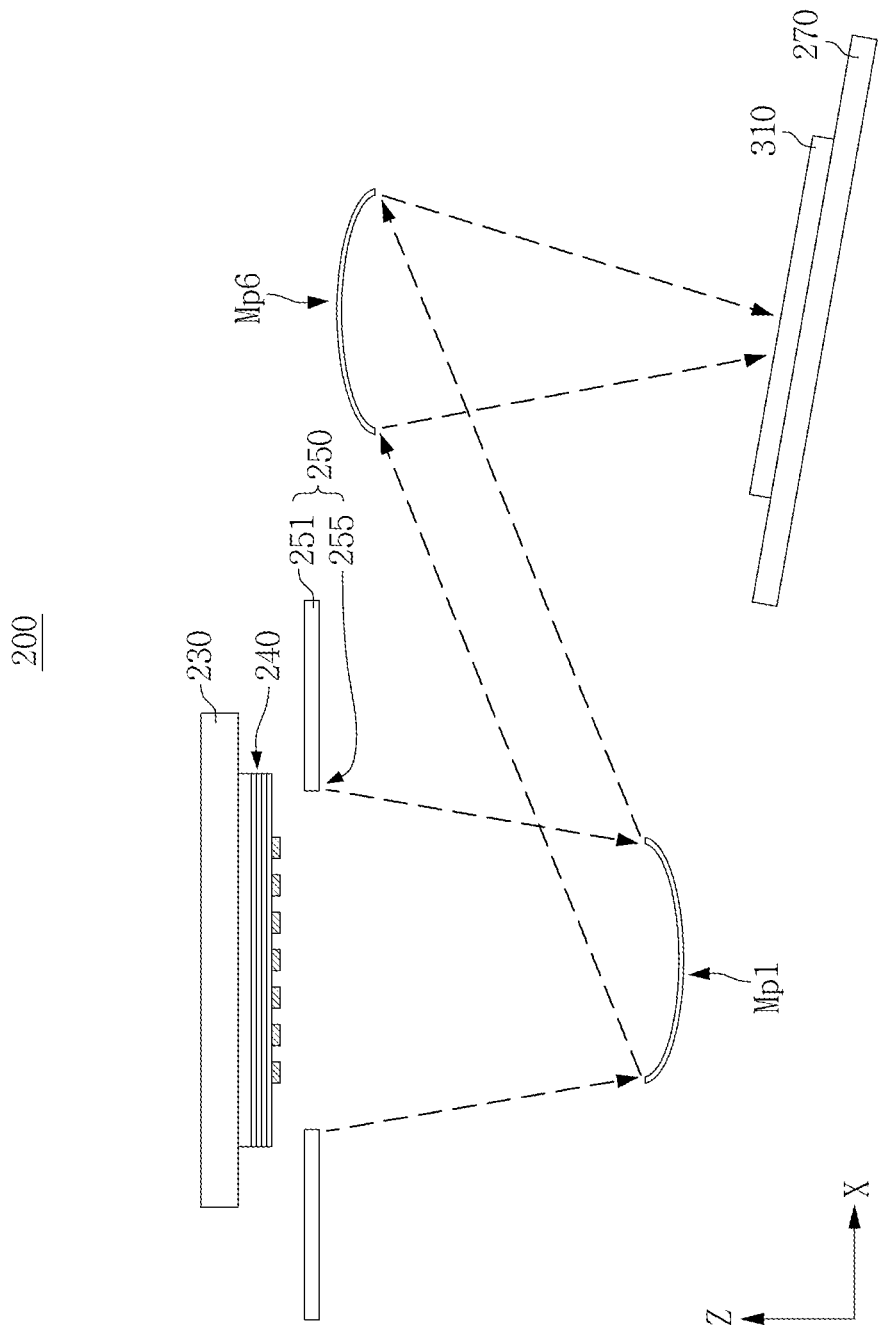

US 8,912,103 B2

METHOD OF FABRICATING AND CORRECTING NANOIMPRINT LITHOGRAPHY TEMPLATES

PRIORITY STATEMENT

This application claims priority under 35 U.S.C. §119 to Korean Patent Application No. 10-2012-0035549 filed on Apr. 5, 2012, the disclosure of which is hereby incorporated by reference in its entirety.

BACKGROUND

1. Field

The inventive concept relates to lithography. More particularly, the inventive concept relates to nanoimprint lithography including the fabricating of nanoimprint lithography templates.

2. Description of Related Art

Lithography is a process by which a pattern can be transcribed onto a substrate such a semiconductor wafer. Photolithography is a lithographic technique in which a photosensitive film (photoresist layer) is exposed to an image of a pattern, and the film is developed to remove the exposed or non-exposed regions thereof thereby patterning the film. Then, an underlying layer may be etched using the patterned film as a mask. Nanoimprint lithography is a next-generation lithography technique in which a pattern is directly and physically imprinted on a substrate.

SUMMARY

In accordance with an aspect of the inventive concept, there is provided a method of fabricating a nanoimprint lithography template which includes installing a reticle on a reticle stage of scanning lithography equipment, mounting a template substrate on a template stage of the scanning lithography equipment, and exposing regions on the template substrate with light emitted by a light source of the scanning lithography equipment in a scanning process performed by the equipment, characterized in that at least one part of the scanning lithography equipment is inclined such that a line passing through the center of light exposing each of the regions, respectively, in the direction in which the light propagates towards the template substrate is incident on the exposure region at an oblique angle.

In accordance with another aspect of the inventive concept, there is provided a method of fabricating a nanoimprint lithography template which includes fabricating a first nanoimprint lithography template having a plurality of chip areas, forming a plurality of pattern areas corresponding to the plurality of chip areas on a semiconductor wafer using the first nanoimprint lithography template, determining a deviation of a layout of the pattern areas from a desired layout, and fabricating a second nanoimprint lithography template that corrects for the deviation, wherein the fabricating of the second nanoimprint lithography template includes a scanning process of scanning the a template substrate with light using scanning lithography equipment, characterized in that a line passing through the center of light exposing the template substrate is incident on the template substrate at an oblique angle.

In accordance with still another aspect of the inventive concept, there is provided a method for use in the mass production of semiconductor devices, which includes fabricating a first nanoimprint lithography template having an imprint pattern divided into a plurality of chip areas, wherein the surface area of the nanoimprint lithography template is at least as great as that of a semiconductor wafer, imprinting the chip areas all at once onto the semiconductor wafer to form patterned areas corresponding to the chip areas, respectively, on the wafer, and determining whether a layout of the patterned areas deviates from a desired layout.

BRIEF DESCRIPTION OF THE DRAWINGS

The foregoing and other features and advantages of the inventive concepts will be more apparent from the following detailed description of the preferred embodiments of the inventive concepts, as illustrated in the accompanying drawings. In the drawings:

FIGS. 8A to 8C are conceptual views illustrating examples of scanning processes in methods of fabricating a corrected nanoimprint lithography template according the inventive concept, using the transmissive type of scanning lithography equipment;

FIGS. 9A and 9B are conceptual views illustrating examples of scanning processes in methods of fabricating a corrected nanoimprint lithography template according the inventive concept, using the reflective type of scanning lithography equipment;

DETAILED DESCRIPTION OF THE PREFERRED EMBODIMENTS

Figure 1A:
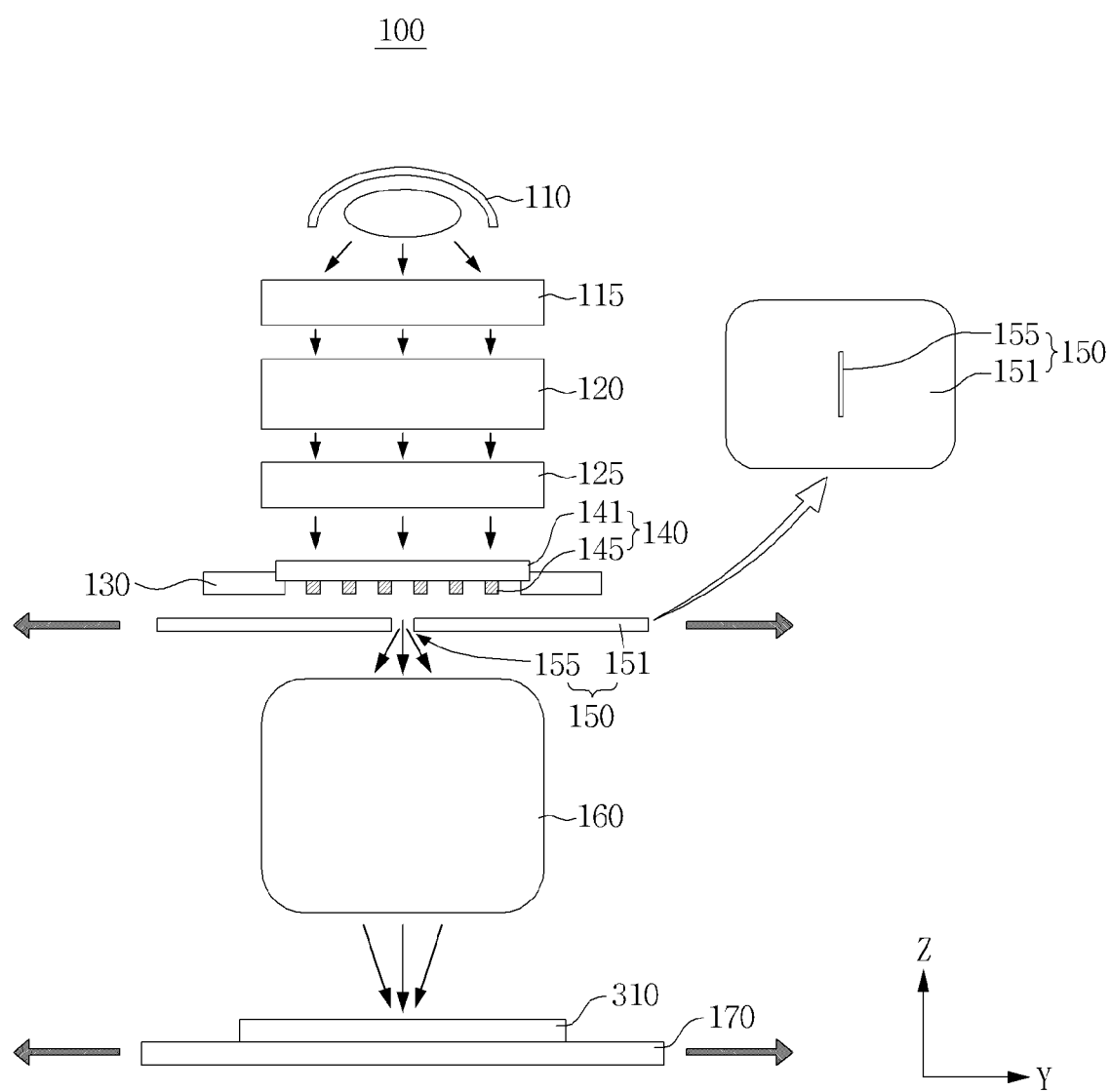
FIG. 1A is a schematic diagram of transmissive type of scanning lithography equipment for use in fabricating a nanoimprint lithography template according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Furthermore, when an element/component is described as being inclined in a particular direction(s), the direction(s) will be understood as the axis/axes of a Cartesian coordinate system and thus, the description will be understood to mean that the plane of the element/component subtends some oblique angle with respect to the axis/axes.

Embodiments of a method of fabricating a nanoimprint lithography template according to the inventive concept will now be described in more detail with reference to FIGS. 1A and 1B and 3A-3B.

In each of these embodiments, the nanoimprint lithography template is fabricated to be at least as large, area-wise, as a semiconductor wafer. Thus, the nanoimprint lithography template can be used to form all of the chip regions (CA) on a semiconductor wafer in a single imprinting process, as will be described in more detail later on with reference to FIGS. 4A-4C.

In one example, transmissive scanning lithography equipment 100 of the type shown in FIG. 1A is used to execute an exposure process of the method.

The transmissive scanning lithography equipment 100 may include a light source 110, light collector 115, light dispersing optics 120, light relaying optics 125, a reticle stage 130 for supporting a reticle, an aperture 150, projection optics 160 and a template stage 170 for supporting a template substrate 310. In this example, a transparent type of reticle 140, referred to hereinafter as a transmissive reticle, is installed on the reticle stage 130.

The light source 110 emits deep ultra violet (DUV) light, for example. To this end, the light source 110 may include a light generator that produces an argon fluoride (ArF) plasma or a krypton fluoride (KrF) plasma. Also, the light source 110 may include a mirror surrounding half of the generator opposite the light collector 115, to reflect light generated by the generator towards the light collector 115.

The light collector 115 collects the light emitted by the light source 110 and comprises a collimator that aligns the rays of the light in one direction, i.e., produces a beam of the light propagating along the optical axis of the transmissive scanning lithography equipment 100. To these ends, the light collector 115 may be a collimating lens.

The light dispersing optics 120 disperses the light such that the intensity of light is more uniform across the spatial cross section of the beam. For example, the light dispersing optics 120 comprises a diffractor such as a fly's eye lens or diffraction grating.

The light relaying optics 125 condenses the beam of light to reduce loss, and transmits the condensed beam towards the reticle stage 130. For example, the light relaying optics 125 comprises a condensing lens and/or a relay lens.

The reticle stage 130 has a hole through the middle thereof, and through which light may pass, and a blind region at the periphery thereof and which is opaque so as to block light incident thereon.

The transmissive reticle 140 may be a binary photomask or a phase shift mask. In any case, the transmissive reticle 140 includes a transparent substrate 141 transparent to light emitted by the light source 110, namely, DUV light in this example, and an opaque optical pattern 145 opaque to the light. Accordingly, the transmissive reticle 140 produces an optical or aerial image corresponding to the optical pattern 145 when the light generated by the light source 110 passes therethrough.

The aperture 150 includes a plate 151 that blocks most of the light passing through the reticle 140 and a slit 155 extending through the plate 151 so as to allow part of the light to be transmitted towards the template stage 170. The slit 155 may be elongated in one direction. In the specification, the longitudinal direction (direction of elongation in a horizontal plane) of the slit 155 is represented by an X-direction, a direction perpendicular to the longitudinal direction of the slit 155 in the horizontal plane is represented by a Y-direction, and a direction perpendicular to both the X- and Y-directions (the vertical direction in which the slit 155 extends through the plate 151) is represented by a Z-direction.

The projection optics 160 projects that part of an aerial image of the optical pattern 145 of the transmissive reticle 140 passing through the slit 155 towards the template stage 170. To this end, the projection optics 160 may comprise a projection lens.

The template substrate 310 is a blank nanoimprint lithography template. Blank refers to the fact that no pattern is present on the template substrate 310.

The reticle stage 130 and the template stage 170 may be linked to move simultaneously in the Y-direction as represented by arrows in the figure. Thus, when light is generated by the light source 110, and the reticle stage 130 and the template stage 170 are moved in the Y-direction, the optical pattern 145 of the transmissive reticle 140 is in effect scanned such that an image of the optical pattern 145 is projected onto and across a surface of the template substrate 310 on the template stage 170.

Figure 1B:
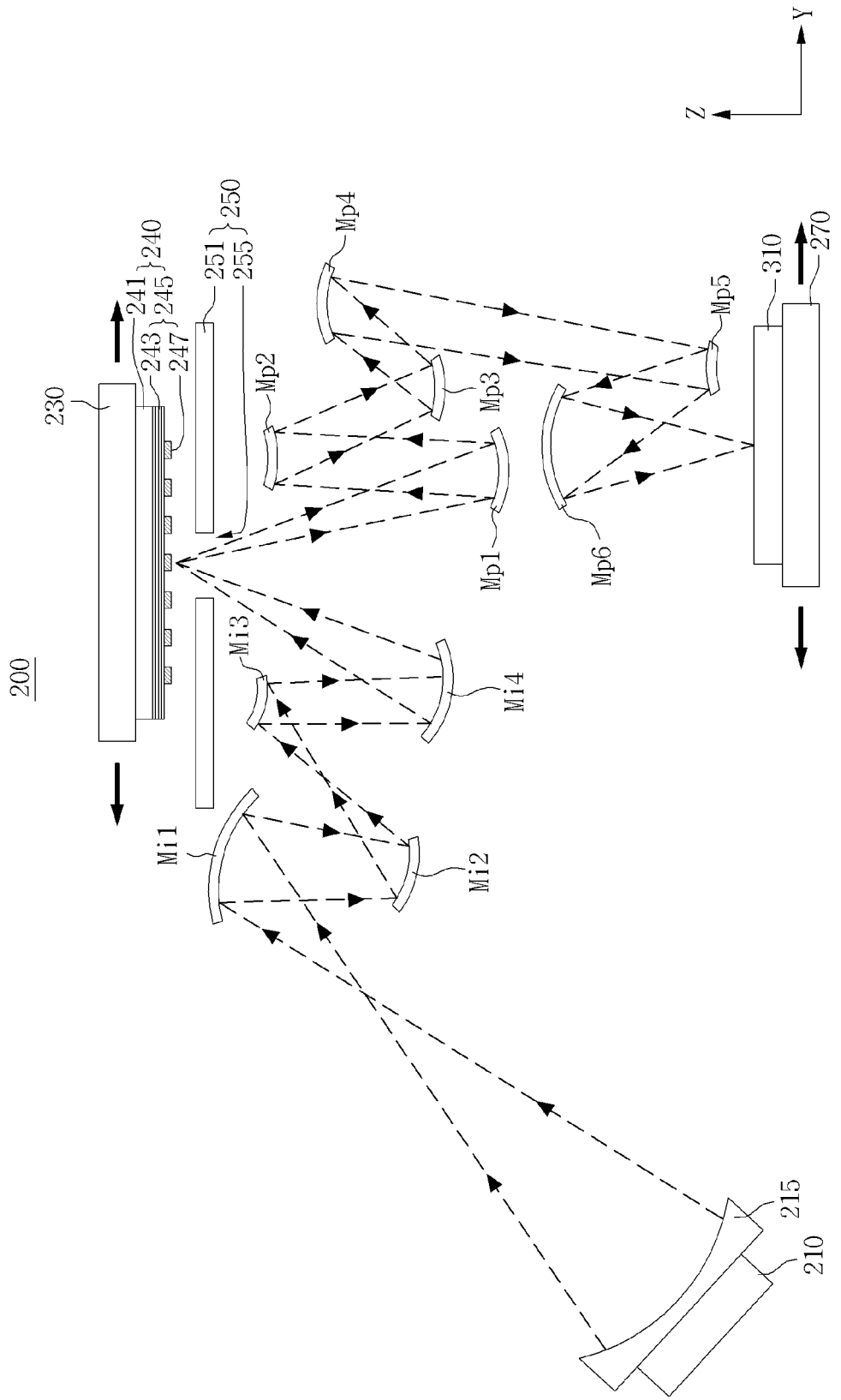
FIG. 1B is a schematic diagram of reflecting type of scanning reflective lithography equipment for use in fabricating a nanoimprint lithography template according to the inventive concept.

In another example of the method, reflective scanning lithography equipment 200 of the type shown in FIG. 1B is used to perform an exposure process of the method.

The reflective scanning lithography equipment 200 may include a light source 210, a light collector 215, illuminating mirrors Mi1 to Mi4, an aperture 250, a reticle stage 230, projection mirrors Mp1 to Mp6 and a template stage 270.

The light source 210 may generate EUV light. To this end, the light source 210 may comprise a $CO_2$ laser.

The light collector 215 collects the light generated by the light source 210 and dispatches the light in a given direction, i.e., along the optical axis of the reflective scanning lithography equipment 200. For example, the light collector 215 may include a collecting mirror.

The illuminating mirrors Mi1 to Mi4 are configured and arranged to reflect the light towards the reticle stage 230. To this end, the illuminating mirrors Mi1 to Mi4 may include a condensing mirror that condenses the special cross section of the light incident thereon, and a relay mirror that serves mainly to relay the light along the optical axis without substantially altering its spatial cross section.

The aperture 250 may include a slit plate 251 and a slit 255 extending through the slit plate 251. The slit plate 251 is opaque to the light so as to block light incident thereon, whereas the slit 255 allows light to pass therethough. The slit 255 may be elongated in one direction. Thus, the aperture 250 may be configured and oriented similarly to the aperture of the equipment 100 shown in and described with reference to FIG. 1A and accordingly, will not be described in further detail here.

In any case, light reflected by the illuminating mirrors Mi1 to Mi4 passes through the slit 255 towards the reticle stage 230 so as to irradiate a reflective reticle 240 mounted on the reticle stage 230.

The reflective reticle 240 selectively reflects light. For example, the reflective reticle 240 has a substrate 241, and an optical pattern 245 comprising a reflection layer 243 that is disposed on the substrate 241 and an absorption pattern 247 disposed on the reflection layer 243. The reflection layer 243 is of material that will reflect a relatively large amount of any of the EUV light incident thereon, whereas the absorption pattern 247 is of material that reflects no or only a relatively small amount of the EUV light incident thereon. Accordingly, the reflective reticle 240 may produce an optical or aerial image corresponding to that of the optical pattern 245.

Light reflected by the reflective reticle 240 passes through the slit 255 to the projection mirrors Mp1 to Mp6. The projection mirrors Mp1 to Mp6 adjust the spatial profile of the light and project the light on a surface of the template substrate 310 mounted on the template stage 270.

The reticle stage 230 and the template stage 270 may be linked to move simultaneously in one direction. For example, the reticle stage 230 and the template stage 270 may move together in the Y-direction perpendicular to the longitudinal axis of the slit 255, as represented by the arrows in the figure. In this was, the slit 255 can effectively scan an image of the optical pattern 245 of the reflective reticle 240 onto and across the surface of the template substrate 310 on the template stage 270.

Figure 2A:
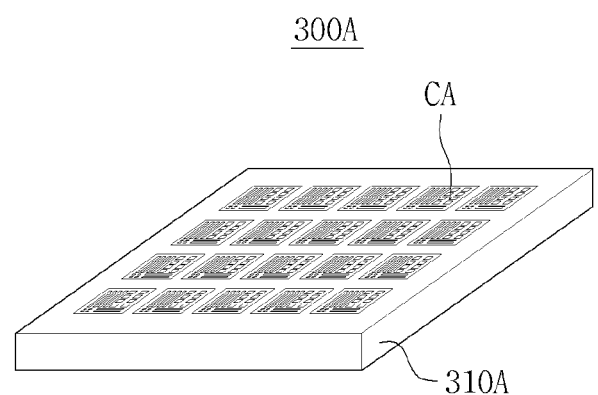
FIGS. 2A and 2B are each a perspective view of a nanoimprint lithography template fabricated according to the inventive concept.
Figure 2B:
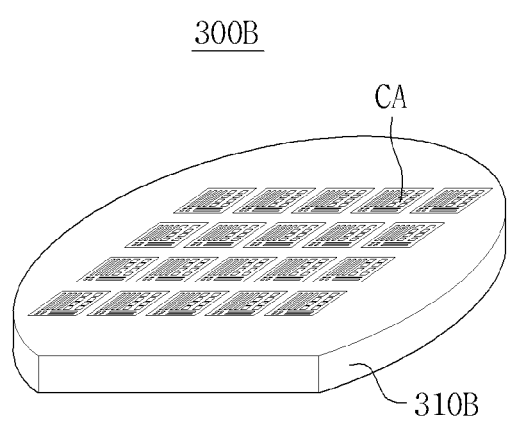

FIGS. 2A and 2B illustrate examples of nanoimprint lithography templates according to the inventive concept, respectively.

Referring to FIGS. 2A and 2B, each of the nanoimprint lithography templates 300A and 300B includes a template substrate 310A, 310B and a plurality of chip areas CA on the template substrate 310A, 310B. The template substrates 310A and 310B may be quartz or silicon wafers. Each chip area CA may be understood as corresponding to a minimum area or unit area optically exposed in a single one of the processes described above, using either the transmissive or reflective scanning lithography equipment 100 or 200.

Referring to FIG. 2A, the nanoimprint lithography template 300A has the shape of a polygon, e.g., a quadrangle, and referring to FIG. 2B, the nanoimprint lithography template 300B has the shape of a semiconductor wafer. In either case, as was mentioned above, the size of the nanoimprint lithography template 300A or 300B in terms of its area is the same as or larger than that of a semiconductor wafer.

FIGS. 3A to 3E illustrate completely an embodiment of a method of fabricating a nanoimprint lithography template according to the inventive concept.

Figure 3A:
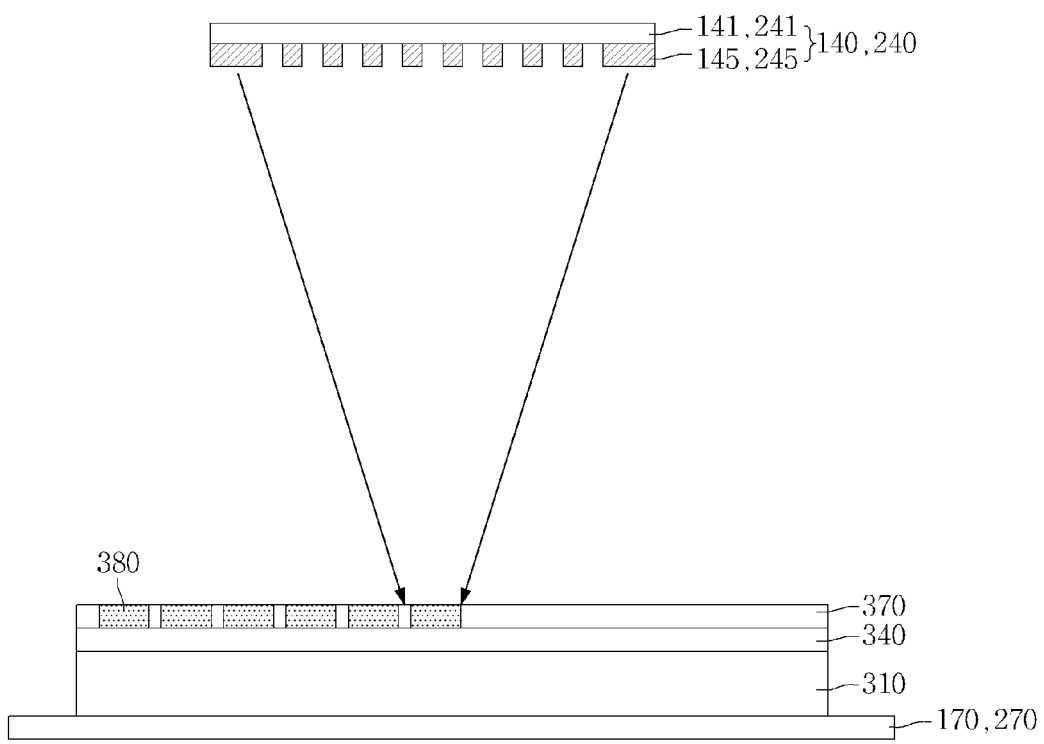
FIGS. 3A to 3E are conceptual diagrams illustrating a process of fabricating an initial nanoimprint lithography template according to the inventive concept.

FIG. 3A shows the transferring of images of optical pattern 145 or 245 of the reticle 140 or 240 onto a template substrate 310 using the scanning lithography equipment 100 or 200. For example, a hard mask 340 and a photoresist layer 370 are stacked on the template substrate 310. The hard mask 340 may be a single- or multi-layered inorganic insulator such as a layer of silicon nitride or silicon oxide, or a layer of silicon oxide and a layer of silicon nitride. Furthermore, the hard mask 340 may further include a metal layer. Alternatively, the hard mask layer 340 may be omitted. In this case, the photoresist layer 370 is formed directly on the template substrate 310.

In any case, the above-described exposure processes are sequentially carried out such that images of the optical pattern 145 or 245 of the reticle 140 or 240 are projected, each on a reduced scale, onto the photoresist layer 370 formed on the template substrate 310. In FIG. 3A, reference numeral 380 represents a unit exposure region exposed by a single one of the exposure processes so that the image of the optical pattern 145 or 245 of the reticle 140 or 240 is transferred to each unit exposure region 380.

Referring back to FIGS. 2A and 2B, the unit exposure region 380 may correspond to one chip area CA or a plurality of chip areas CA. Specifically, when only one chip area CA is formed by a single exposure process, the unit exposure region 380 corresponds to one chip area CA. On the other hand, when a plurality of chip areas CA are formed by a single exposure process, the unit exposure region 380 corresponds to the plurality of chip areas CAs. This embodiment will be described with respect to the case in which each unit exposure region 380 corresponds to a respective chip area CA. Therefore, it will be understood that in this example, the plurality of unit exposure regions 380 are formed by repeating the exposure process several times.

Figure 3B:
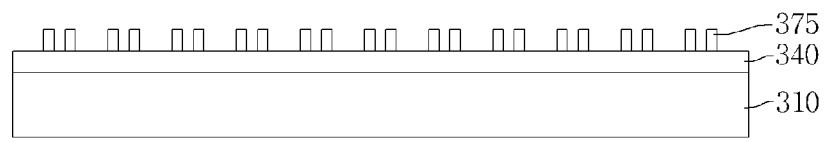

Referring to FIG. 3B, the exposed photoresist layer 370 is then developed to form a photoresist pattern 375. The developing process may include a wet developing process. For example, an alkaline chemical may be dispersed over the entire surface of the photoresist layer 370 to selectively react with the exposed or non-exposed regions. The selectively reacted region is removed, so that the non-reacted region remains as the photoresist pattern 375.

Figure 3C:
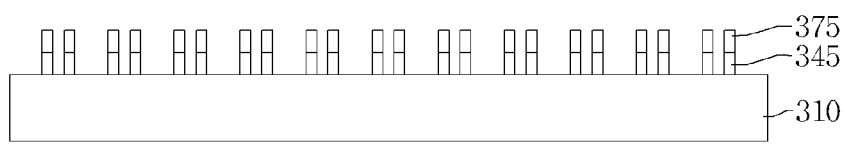

Referring to FIG. 3C, in the case in which the hard mask 340 is used, the hard mask 340 is etched using the photoresist pattern 375 as an etch mask to form a hard mask pattern 345. Afterwards, the photoresist pattern 375 may be removed. The photoresist pattern 375 can be removed by ashing using oxygen plasma or by a wet strip method using sulfuric acid or the like.

Figure 3D:
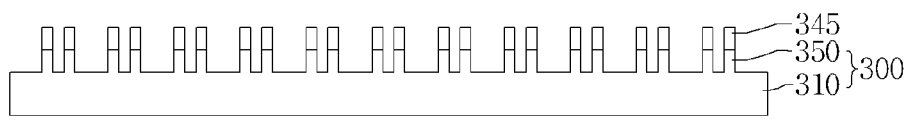

Referring to FIG. 3D, next, an imprint pattern 350 is formed on a surface of the nanoimprint lithography template substrate 310 using the hard mask pattern 345 as an etch mask. For example, the template substrate 310 is etched with plasma containing a halogen element and/or inert element, using the hard mask pattern 345 as an etch mask, to form imprint pattern 350. In the case in which the hard mask 340 is omitted, the template substrate 310 can be etched using the photoresist pattern as an etch mask.

Figure 3E:
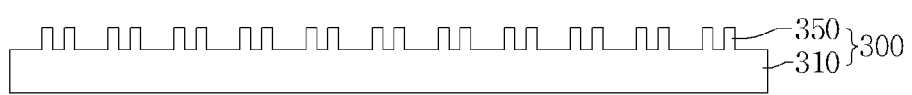

Referring to FIG. 3E, the hard mask pattern 345 (or the photoresist pattern at this stage) is removed. The hard mask pattern 345 can be removed by a dry etching method using a radical of a halogen element or plasma or by a wet etching method using phosphoric acid or hydrofluoric acid.

In the example of this embodiment described above, the imprint pattern 350 is a unitary part of the template substrate 310. However, in another example, the imprint pattern 350 is not part of the template substrate 310 but is part of a layer of material formed on the template substrate 310. In this case, the layer of material is patterned to form the imprint pattern 350.

A method of forming a pattern on a semiconductor wafer using a nanoimprint lithography template 300 according to the inventive concept will now be described with reference to FIGS. 4A to 4F.

Figure 4A:
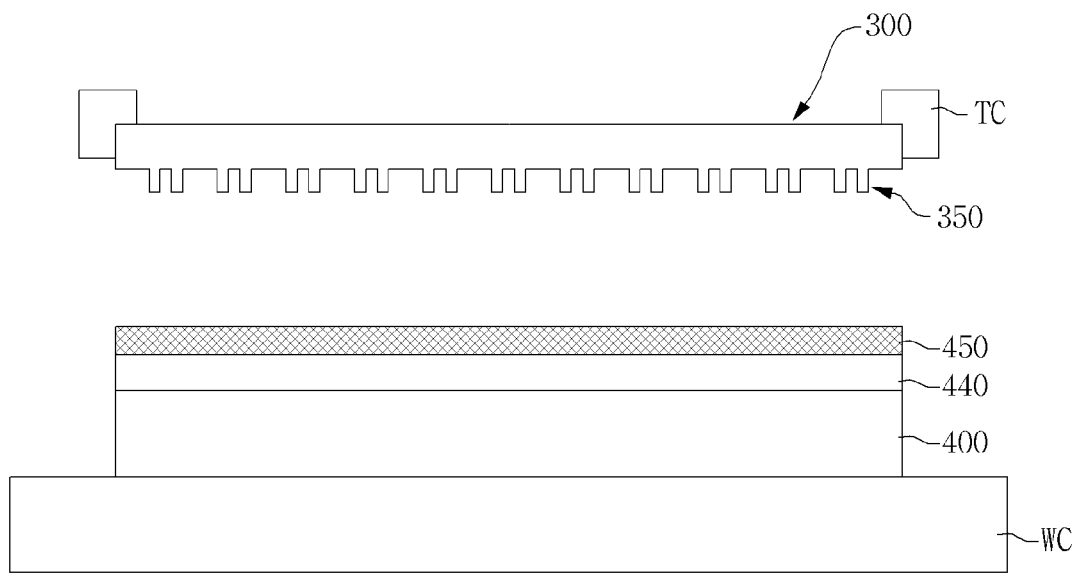
FIGS. 4A to 4F are conceptual diagrams illustrating a method of forming a pattern on a semiconductor wafer using a nanoimprint lithography template according to the inventive concept.

Referring to FIG. 4A, the method includes placing a semiconductor wafer 400 having a target (material) layer 440 and a polymer layer 450 stacked thereon on a wafer chuck, and aligning the nanoimprint lithography template 300 with the wafer 400. For instance, the nanoimprint lithography template 300 may be supported by a template carrier TC with its imprint pattern 350 facing downward directly towards the polymer layer 500. At this time, the polymer layer 450 is in a state in which it may be plastically deformed, e.g., the polymer layer 450 may be in a gel state.

Figure 4B:
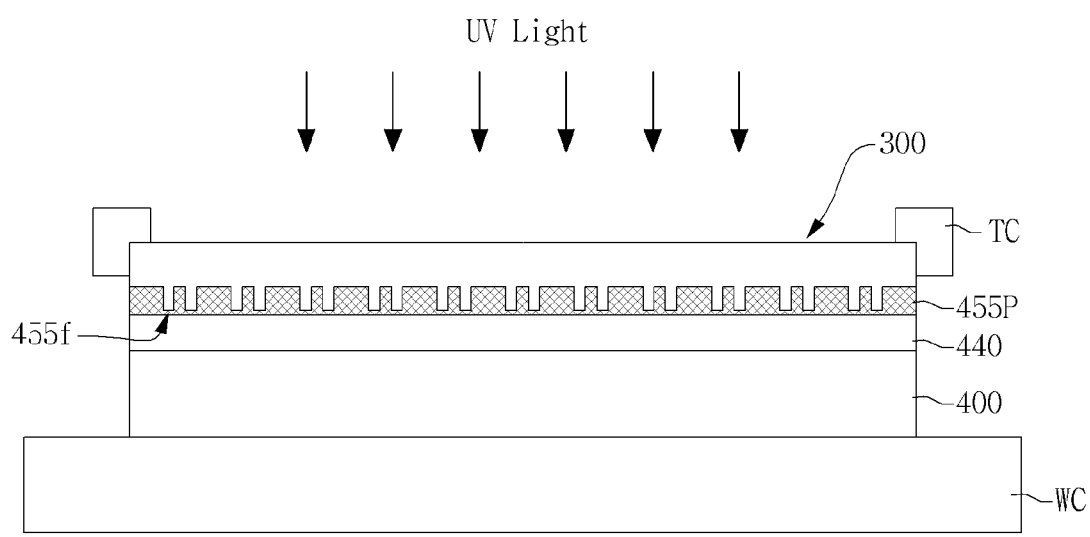

Referring to FIG. 4B, the nanoimprint lithography template 300 and the polymer layer 455 on the semiconductor wafer 400 are then brought together in this state, e.g., the imprint pattern 350 is lowered into the polymer layer 450, such that the imprint pattern 350 of the nanoimprint lithography template 300 is imprinted on the polymer layer 450. In this process, a preliminary polymer pattern 455p having an inverted shape of the imprint pattern 350 of the nanoimprint lithography template 300 is formed. Afterwards, the preliminary polymer pattern 455p is irradiated from a back side of the nanoimprint lithography template 300 with ultra violet (UV) light. In this process, the preliminary polymer pattern 455p is hardened to form polymer pattern 455. The hardening of the preliminary polymer pattern 455p may occur as the result of a cross-linking reaction in the polymer layer 450.

Figure 4C:
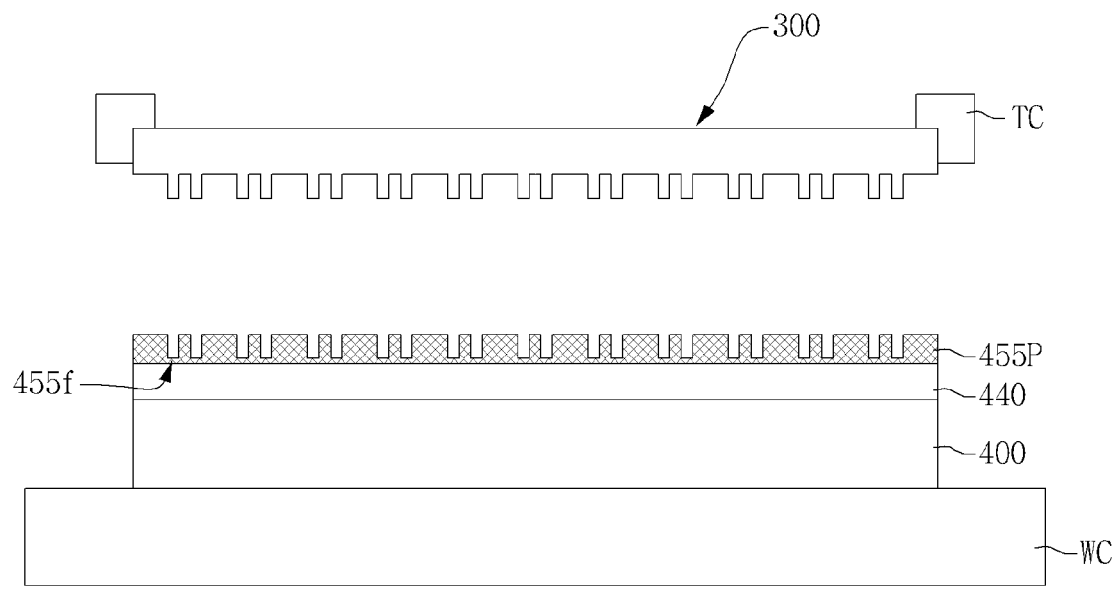

Referring to FIG. 4C, the nanoimprint lithography template 300 is then separated from the hardened polymer pattern 455. At this time, a footprint 455f of the polymer pattern 455 may remain on the target layer 440. However, in some cases, basically none of the footprint 455f remains.

Figure 4D:
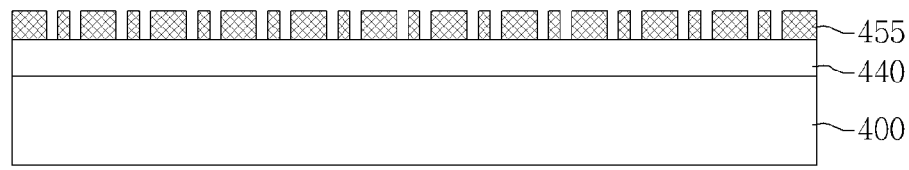

Referring to FIG. 4D, in the case in which a substantial footprint 455f remains, the footprint 455f may be removed by a reactive etching process, such as by using plasma containing oxygen, which reacts with the polymer constituting the pattern 455. In this process, the thickness of the polymer pattern 455 may slightly decrease. However, this process is optional and thus, may be omitted.

Figure 4E:
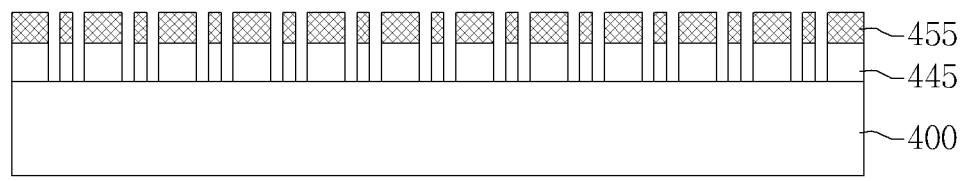

Referring to FIG. 4E, the target layer 440 is then etched using the polymer pattern 455 as an etch mask. As a result, the target layer 440 is patterned to form pattern 445 on the wafer 400.

Figure 4F:
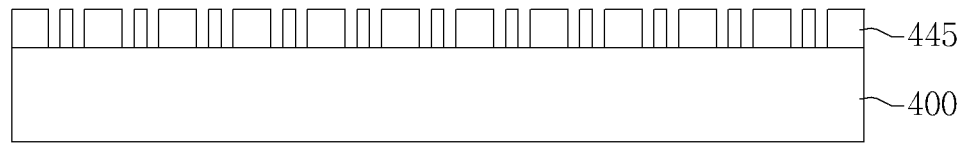

Referring to FIG. 4F, finally, the polymer pattern 455 may be removed completely from the pattern 445 formed on the semiconductor wafer 400

FIGS. 5A to 5D show semiconductor wafers 400 and 401a to 401c having pattern areas PA formed by a nanoimprint lithography template 300 according to the inventive concept. The shape and size of the pattern areas PA of the semiconductor wafers 400 and 401a to 401c correspond to those of the chip regions CA of the nanoimprint lithography template 300. More specifically, the pattern areas PA of the semiconductor wafers 400 and 401a to 401c are formed to be on the same scale as and mirror images of the chip regions CA of the nanoimprint lithography template 300.

Figure 5A:
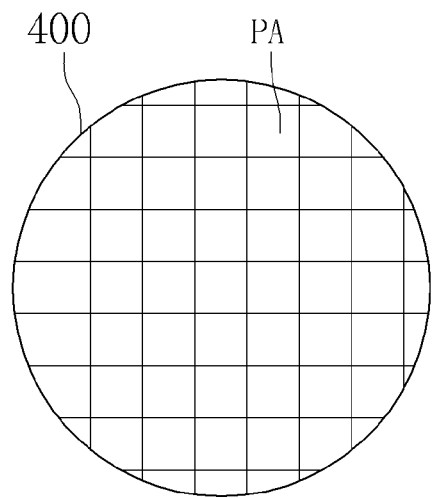
FIGS. 5A to 5D are schematic top views of semiconductor wafers having pattern areas that may be formed using the initial nanoimprint lithography template.
Figure 5B:
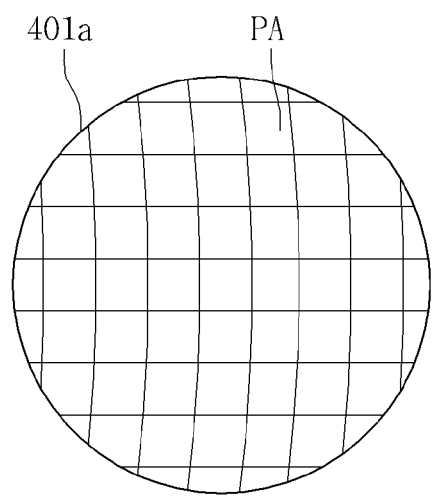
Figure 5C:
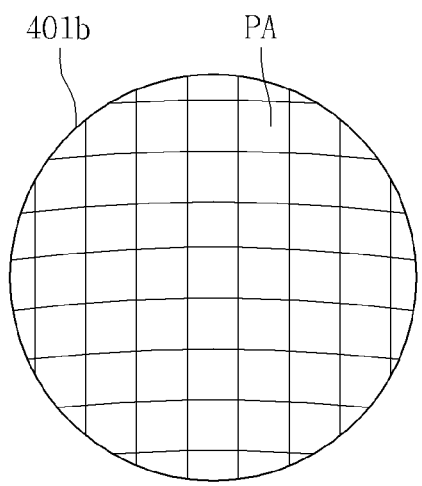
Figure 5D:
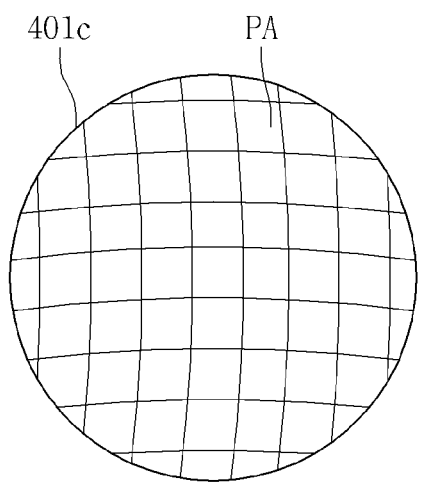

The pattern areas PA of the semiconductor wafer 400 shown in FIG. 5A illustrate a case of relatively exact alignment or correspondence with the chip areas CA of the nanoimprint lithography template 300. On the other hand, the pattern areas PA of the semiconductor wafers 401a to 401c reveal that there was some process factor that gave rise to a bias in the pattern areas PA (deviation from a state of exact alignment or correspondence). Specifically, FIG. 5B shows a bias in a first horizontal direction, FIG. 5C shows a bias in a second horizontal direction orthogonal to the first horizontal direction, and FIG. 5D shows a bias in both the first and second horizontal (orthogonal) directions.

One of factors that may create the bias in the pattern areas PA on the semiconductor wafers 401a to 401c is that in general, the preliminary polymer pattern 455p on each of the semiconductor wafers 401a to 401c shrinks in the process of being hardened. If the preliminary polymer pattern 455p were to shrink evenly throughout, the bias could be minimized merely by enlarging the imprint pattern 350 of the nanoimprint lithography template 300. However, as illustrated, the bias may manifest itself in only one direction, i.e., unevenly. Also, as illustrated in the drawing, the degree of the bias may vary amongst the pattern areas PA. For example, as in the case of each of the wafers 401a to 401c, the pattern areas PA alongside an imaginary line passing through the center of the semiconductor wafer may exhibit a greater amount of bias than the pattern areas PA disposed along the periphery of the semiconductor wafer. Thus, it would be very difficult to redesign the chip areas CA and/or imprint pattern 350 of the nanoimprint lithography template 300 to compensate for these types of bias.

Figure 6A:
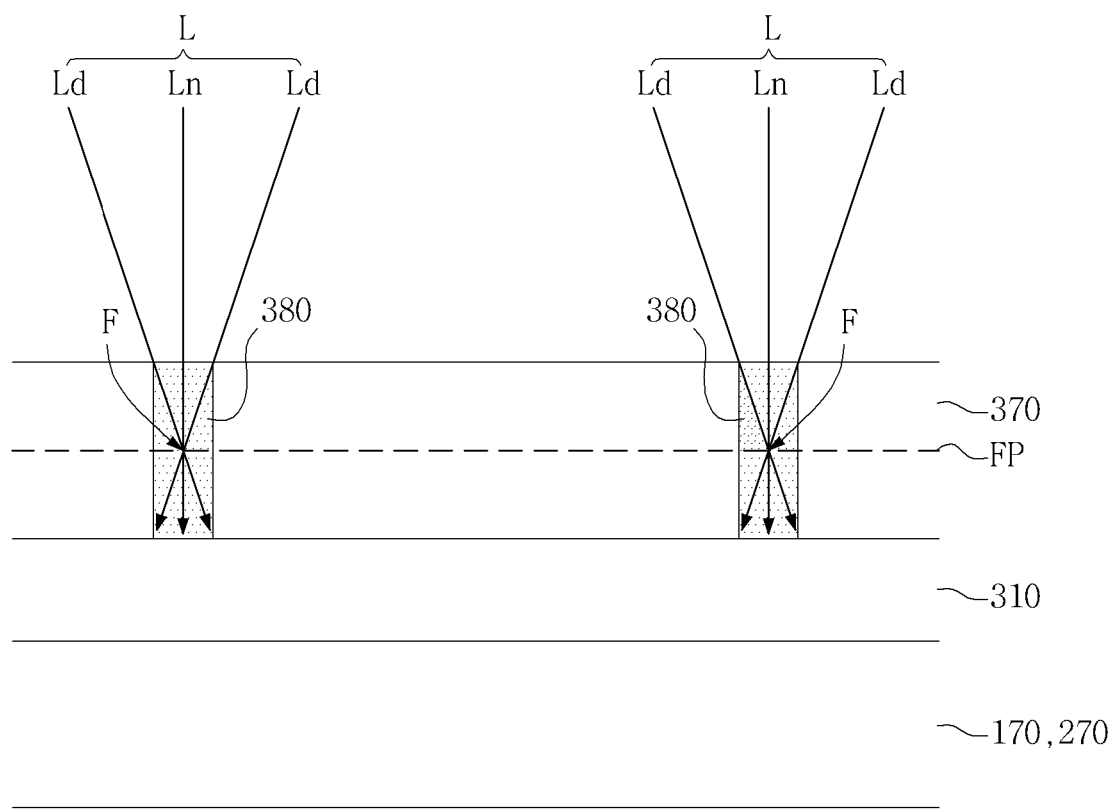
FIG. 6A is a conceptual diagram illustrating an exposure process in a method of fabricating an initial nanoimprint lithography template according to the inventive concept.
Figure 6B:
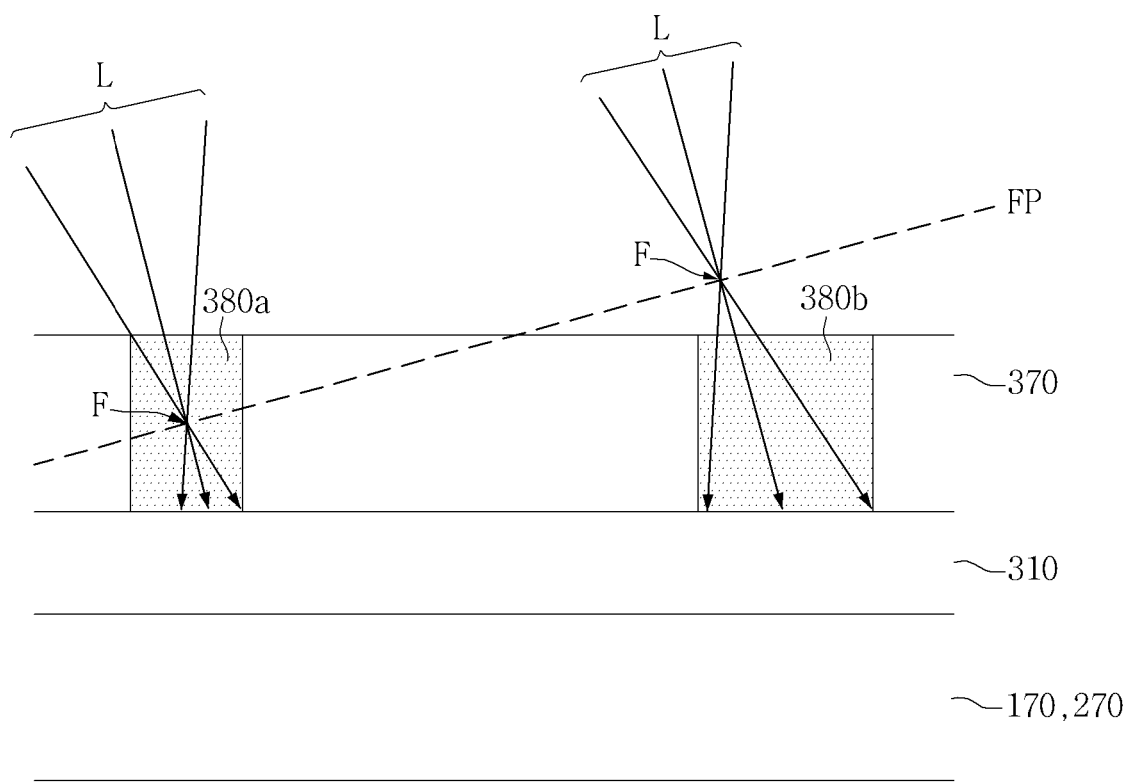
FIGS. 6B and 6C are conceptual diagrams each illustrating an exposure process in the fabricating of a corrected nanoimprint lithography template according to the inventive concept.
Figure 6C:
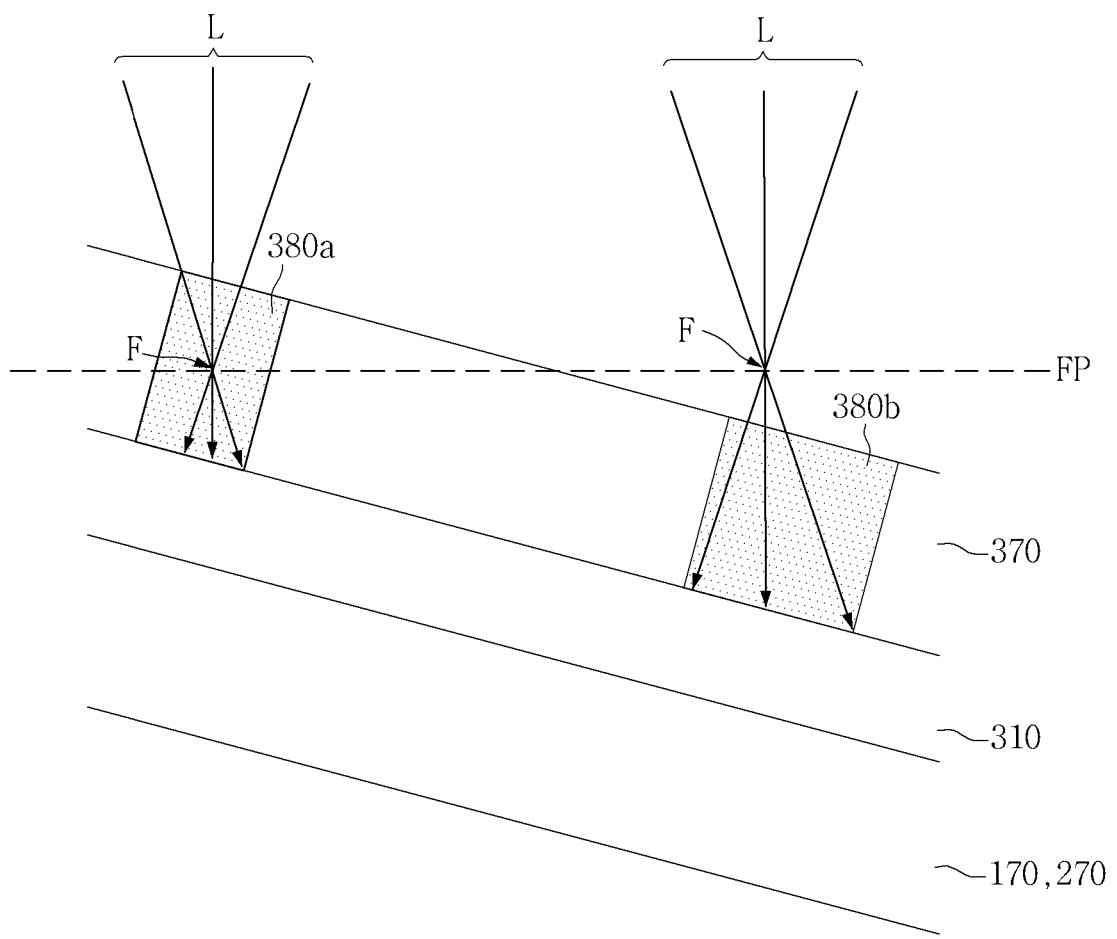

FIGS. 6A to 6C illustrate one embodiment of a method of fabricating a corrected nanoimprint lithography template 300, to compensate for process factors which would otherwise give rise to a bias in the pattern areas formed on a wafer using the template, according to the inventive concept.

FIGS. 6A to 6C are sectional views of the templates during the course of their fabrication, e.g., in the X-direction or longitudinal direction of slit 155 or 255 of the scanning lithography equipment 100 or 200 (refer back to FIGS. 1, 2 and 3A). The method of fabricating a corrected nanoimprint lithography template 300 according to the inventive concept includes causing a central ray or portion of light L incident on the photoresist layer 370 on the template substrate 310 to be inclined thereto. Or thought of another way, the method of fabricating a corrected nanoimprint lithography template 300 according to the inventive concept includes varying the angle of incidence of the exposure light to include angles other than 90°.

FIG. 6A is a conceptualized view of an exposed region of the photoresist layer 370 when a surface of the reticle 140 or 240 is perpendicular to that of the template substrate 310, i.e., when a line passing through the center of (each of the spatial cross sections of) the light L irradiating an exposure region 380 in the general direction along which the light L propagates is perpendicular to the template substrate 310. In this case, unit exposure regions 380 of uniform areas, volumes, widths or sizes, etc. in proportion to those of the optical patterns 145 or 245 of the reticle 140 or 240 are formed. As can also be appreciated from FIG. 3A, in the case in which a reduction-exposure method is employed, the exposure light will not only include rays of incident light Ln perpendicular to the template substrate 310 but also rays of incident light Ld inclined relative to the template substrate 310. The perpendicular light rays Ln are those that propagate along the center of the path along which the set of incident light rays Ln and Ld propagates. Furthermore, respective sets of the incident light rays Ln and Ld may each have a focus F. Therefore, the incident light rays Ln and Ld may have a focal plane FP. Ideally, the focal plane FP is a horizontal plane.

FIGS. 6B and 6C are conceptualized views of an exposed area of the photoresist layer 370 when the surface of the reticle 140 or 240 is not parallel to that of the template substrate 310, i.e., when the direction in which the light L propagates is not perpendicular to the template substrate 310. Specifically, FIG. 6B conceptually illustrates a case in which the template substrate 310 is maintained horizontal, and FIG. 6C illustrates a case in which the template substrate 310 is inclined relative to the horizontal. In these cases, the unit exposure regions 380 of different sizes, volumes, widths or sizes and not in proportion to those of the optical patterns 145 or 245 of the reticles 140 or 240 are formed. Specifically, the size or volume of a unit exposure region 380a disposed relatively close to the slit 155 or 255 may be different from that of a unit exposure region 380b disposed relatively far therefrom.

Using the effects shown in these figures, a method of fabricating a corrected nanoimprint lithography template 300 according to the inventive concept may include adjusting the position of the focal plane FP of the exposure light L to produce unit exposure regions 380 whose dimensions vary. In addition, the unit exposure regions 380 are exposed at different rates by the light L in this technique. The ease at which the exposed regions may be removed (by the aforementioned developing processes) may be dependent on the rate at which the region was exposed. Accordingly, exposure process threshold conditions are appropriately set to an intermediate degree to ensure complete removal, so that the ultimate imprint pattern may be most elaborate.

FIGS. 7A to 7E illustrate various techniques that may be employed in a method of fabricating a corrected nanoimprint lithography template 300 according to the inventive concept.

Figure 7A:
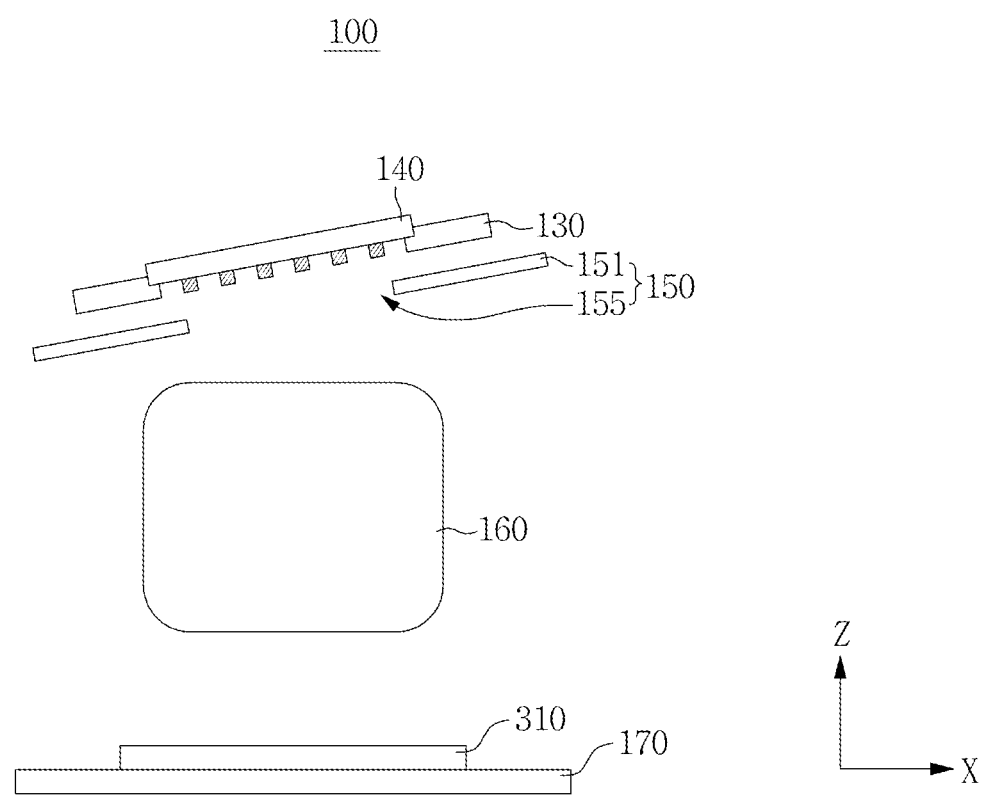
FIGS. 7A to 7E are conceptual views illustrating various layouts of scanning lithography equipment during the course of fabricating a corrected nanoimprint lithography template according to the inventive concept.

Referring to FIG. 7A, in the method using transmissive scanning lithography equipment 100, the technique comprises inclining the reticle stage 130 and the aperture 150 in a (±) X-direction and/or (±) Z-direction. Because the reticle stage 130 is inclined, the transparent substrate 141 and optical patterns 145 of the transparent reticle 140 are inclined as well. Again, the (±) X-direction corresponds to the longitudinal or lengthwise direction of the elongated slit 155. The (±) Z-direction may denote a direction parallel to the shortest distance between the reticle stage 130 and the template stage 170. The angle of inclination may be varied and independently set according to the bias of the chip areas CA (refer back to the description of FIGS. 5A to 5D), and may also take into account characteristics of the process equipment, and of other processes in the forming of the pattern on the semiconductor wafer. The reticle stage 130 and the template stage 170 are movable in a horizontal direction perpendicular to the (±) X-direction.

Figure 7B:
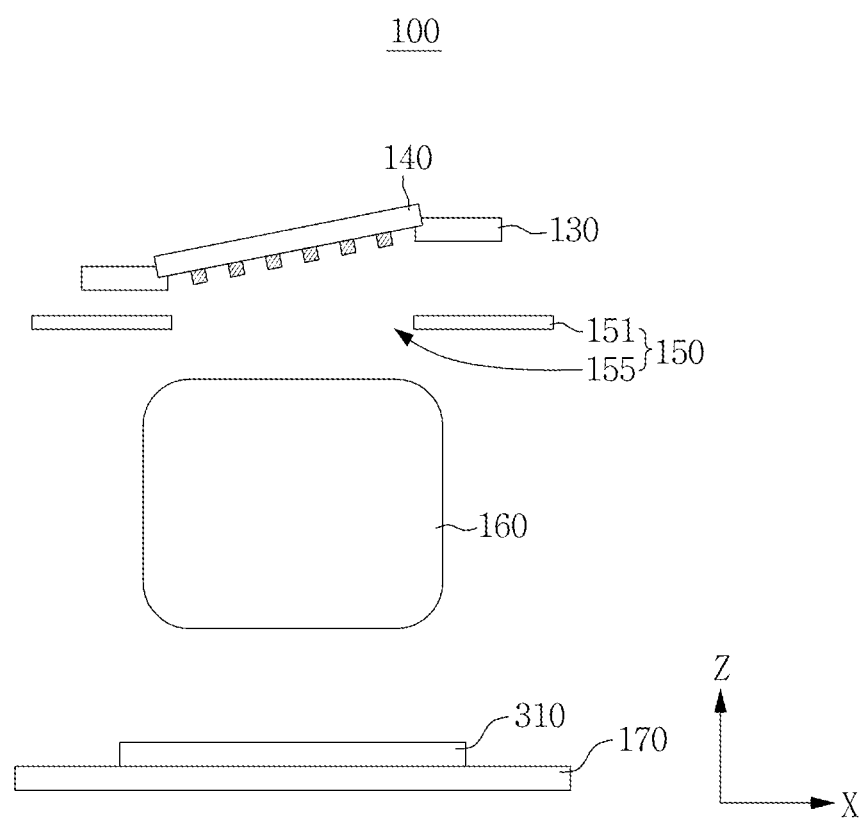

Referring to FIG. 7B, in the method using the transmissive scanning lithography equipment 100, the technique comprises inclining transparent reticle 140 is inclined in a (±) X- and/or (±) Z-direction while maintaining the aperture 150 horizontal. For example, part of the reticle stage 130 raised or lowered, so that the transparent reticle 140 is inclined.

Figure 7C:
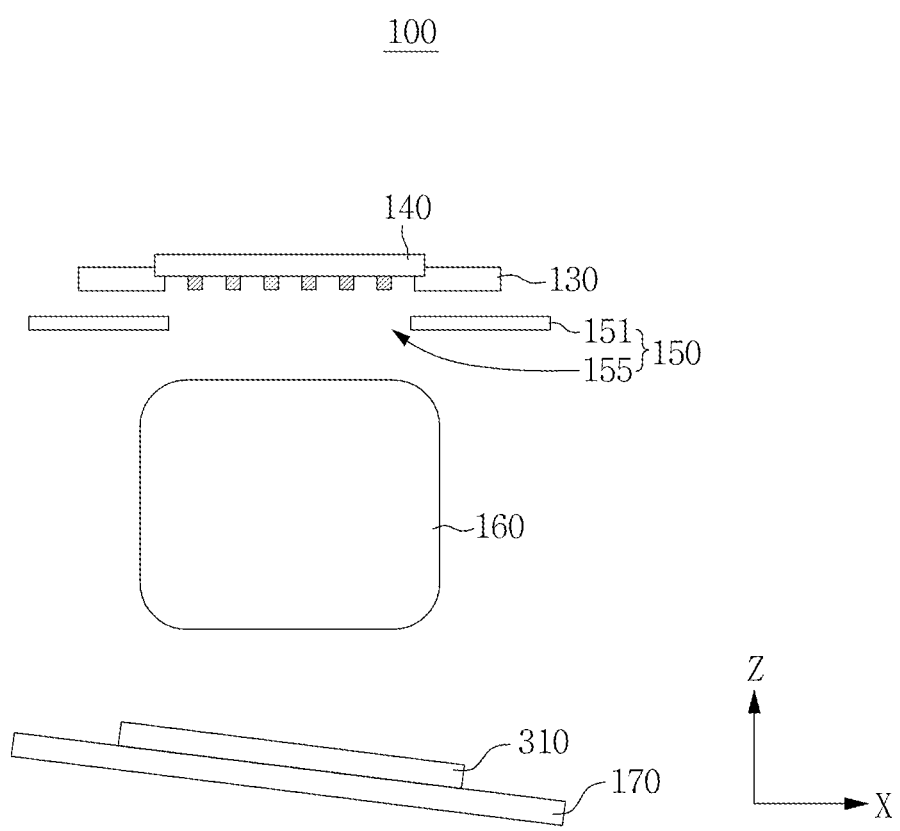

Referring to FIG. 7C, in the method using the transmissive scanning lithography equipment 100, the technique comprises inclining the template substrate 310 in a (±) X-direction and/or (±) Z-direction. To this end, the template stage 170 or template substrate 310 may be inclined in a (±) X-direction and/or (±) Z-direction.

Figure 7D:
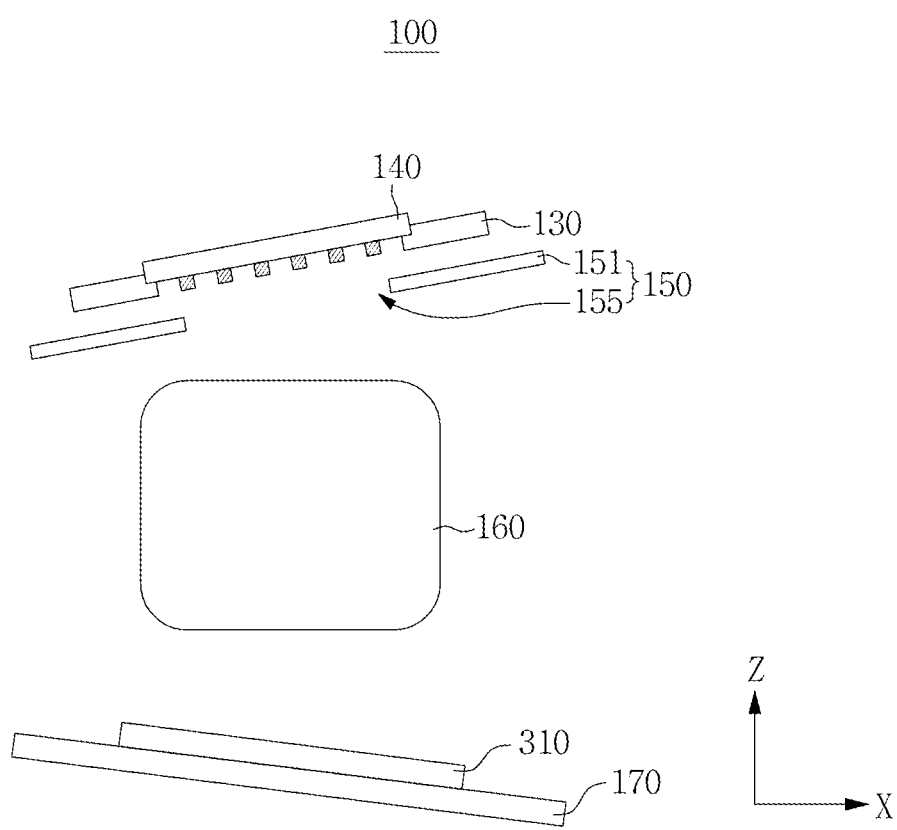

Referring to FIG. 7D, in the method using the transmissive scanning lithography equipment 100, the technique comprises inclining the reticle stage 130 and the template stage 170 each in a (±) X-direction and/or (±) Z-direction.

Figure 7E:
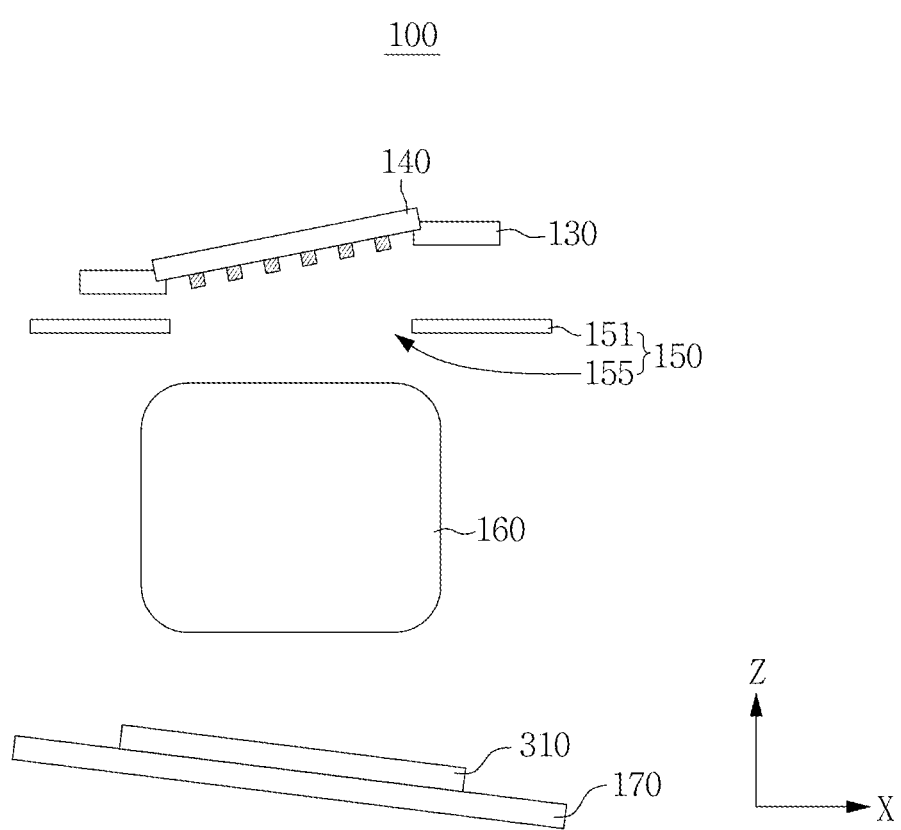

Referring to FIG. 7E, in the method using the transmissive scanning lithography equipment 100, the technique comprises inclining the transparent reticle 140 and the template stage 170 each in a (±) X-direction and/or (±) Z-direction.

Figure 8A:
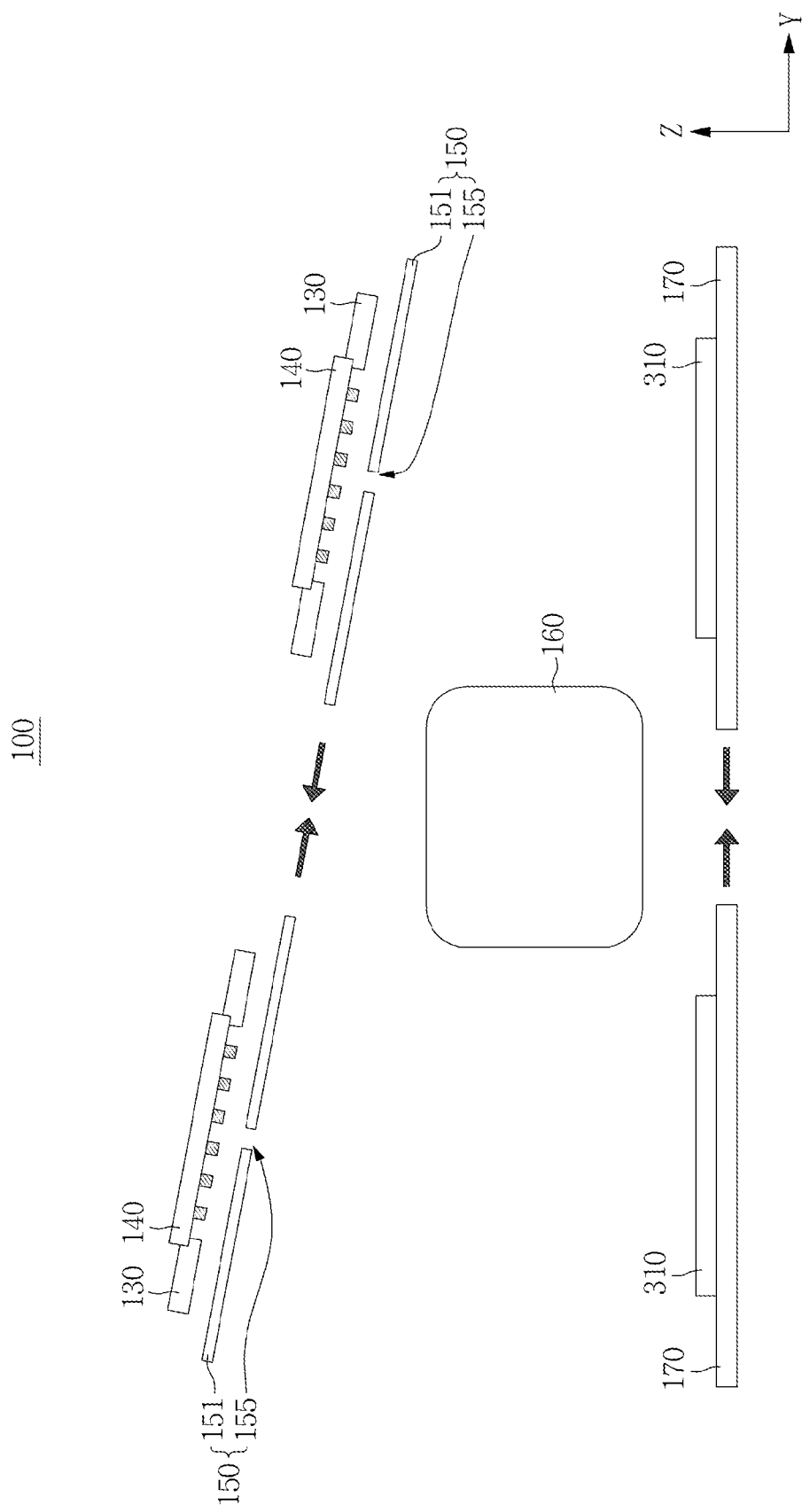
Figure 8C:
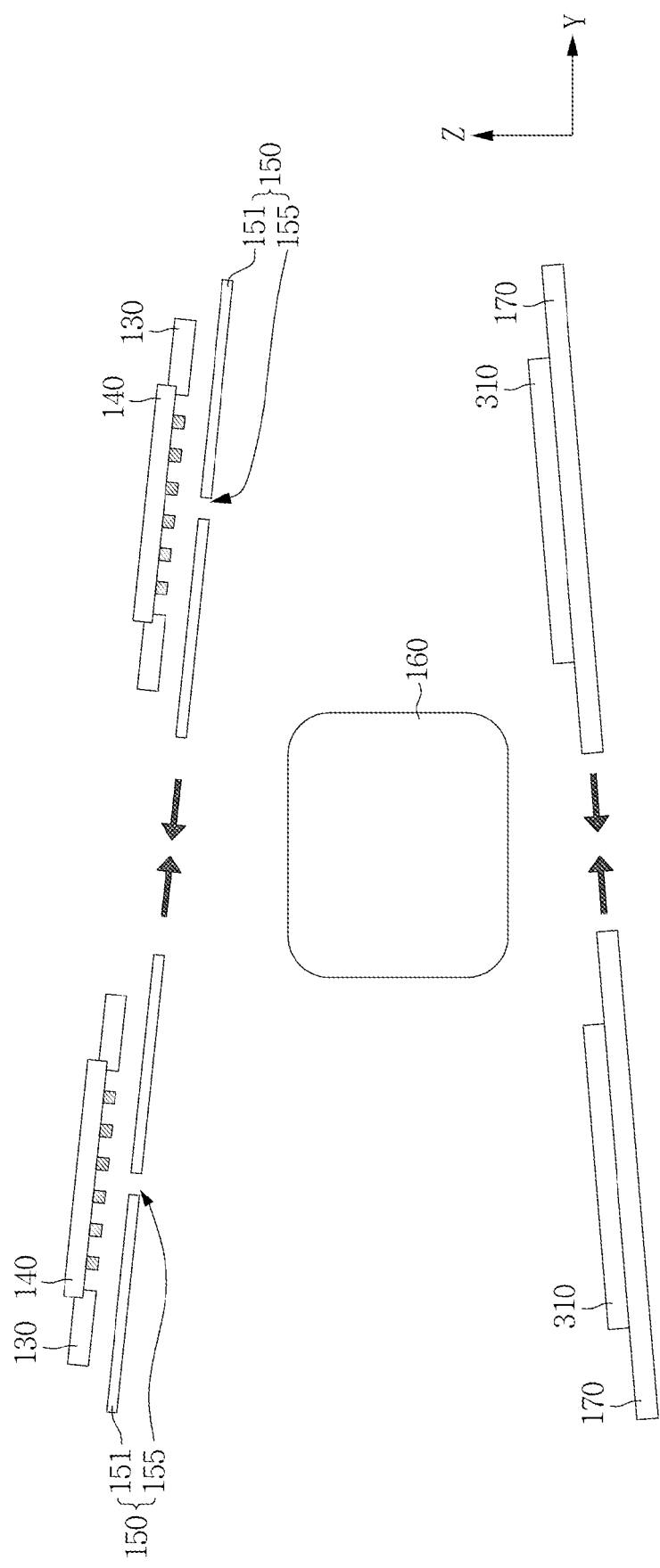

FIGS. 8A to 8C illustrate various embodiments of methods of fabricating a corrected nanoimprint lithography template 300 according to the inventive concept.

In the method illustrated in FIG. 8A, the photoresist layer 370 on the template substrate 310 is exposed using the transmissive scanning lithography equipment 100, while the reticle stage 130 is inclined (e.g., as described with reference to FIG. 7A) and the template stage 170 and the reticle stage 130 are moved simultaneously in the (±) Y-direction.

In the method illustrated in FIG. 8B, the photoresist layer 370 on the template substrate 310 is exposed using the transmissive scanning lithography equipment 100, while the template stage 170 is inclined (e.g., as described with reference to FIG. 7C) and the template stage 170 and the reticle stage 130 are moved simultaneously in the (±) Y-direction.

In the method illustrated in FIG. 8C, the photoresist layer 370 on the template substrate 310 is exposed using the transmissive scanning lithography equipment 100, while the reticle stage 130 and the template stage 170 are inclined (e.g., as described with reference to FIG. 7D) and the template stage 170 and the reticle stage 130 are moved simultaneously in the (±) Y-direction.

Figure 9B:
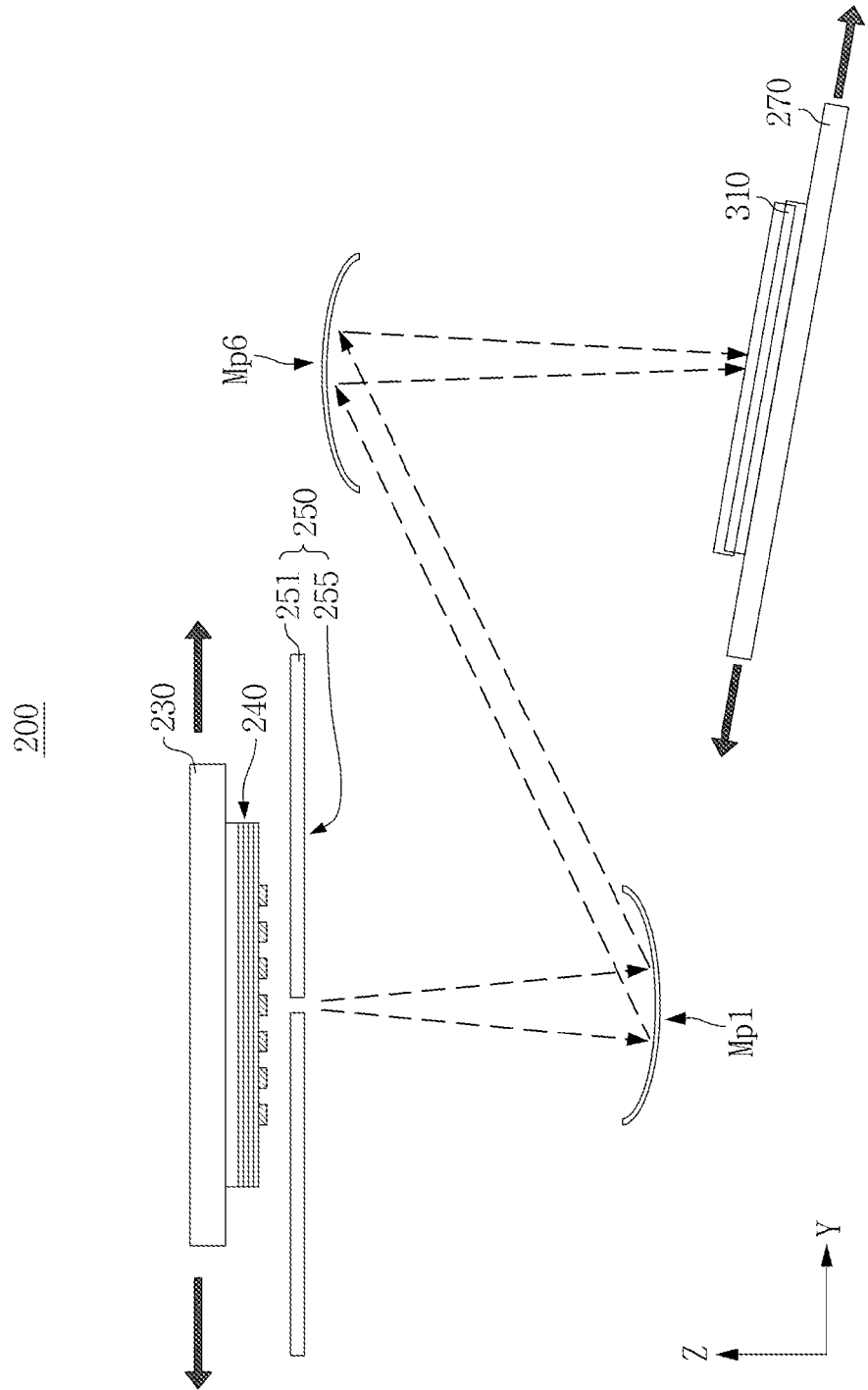

FIGS. 9A and 9B illustrate other embodiments of methods of fabricating a corrected nanoimprint lithography template 300 according to the inventive concept.

In the method illustrated in FIG. 9A, the photoresist layer 370 on the template substrate 310 is exposed to light (illustrated by dotted lines) using reflective scanning lithography equipment 200. In the figure, only the first and last of the projection mirrors Mp1 and Mp6 are illustrated. Also, during this time, the template stage 270 is inclined in a (±) X-direction and/or (±) Z-direction. The (±) X-direction is parallel to the longitudinal or lengthwise direction of the elongated slit 155. Furthermore, similarly to the methods described above, the angle of inclination (of the template stage 270) may be varied and independently set according to the bias of the chip areas CA (refer back to the description of FIGS. 5A to 5D), and may also take into account characteristics of the process equipment, and of other processes in the forming of the pattern on the semiconductor wafer.

In the method illustrated in FIG. 9B, the photoresist layer 370 on the template substrate 310 is irradiated using the reflective scanning lithography equipment 200, while the template stage 270 is inclined in a (±) Y-direction and/or (±) Z-direction and the template stage 270 is moved in the (±) Y-direction. Also, only the first and last of the projection mirrors Mp1 and Mp6 are illustrated.

Figure 10A:
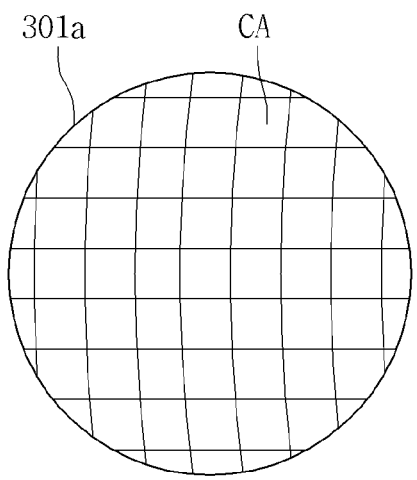
FIGS. 10A to 10C are top views of examples of corrected nanoimprint lithography templates fabricated according to the inventive concept.
Figure 10B:
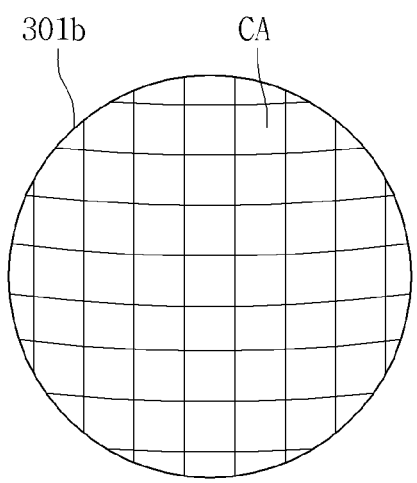
Figure 10C:
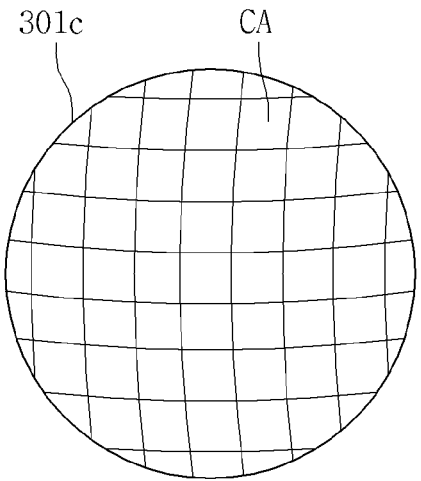

FIGS. 10A to 10C show corrected nanoimprint lithography templates 301a to 301c fabricated according to the inventive concept.

The corrected nanoimprint lithography templates 301a to 301c have chip areas CA formed to compensate for and hence, minimize or prevent, the biases in the pattern areas PA in semiconductor wafers shown in and described with reference to FIGS. 5B to 5D, respectively. That is, the corrected nanoimprint lithography template 301a illustrated in FIG. 10A may minimize or prevent the occurrence of the biased pattern areas PA of the semiconductor wafer 401a illustrated in FIG. 5B. The corrected nanoimprint lithography template 301b illustrated in FIG. 10B may minimize or prevent the occurrence of the biased pattern areas PA of the semiconductor wafer 401b illustrated in FIG. 5C. The corrected nanoimprint lithography template 301c illustrated in FIG. 10C may minimize or prevent the occurrence of the biased pattern areas PA of the semiconductor wafer 401c illustrated in FIG. 5D.

Figure 11A:
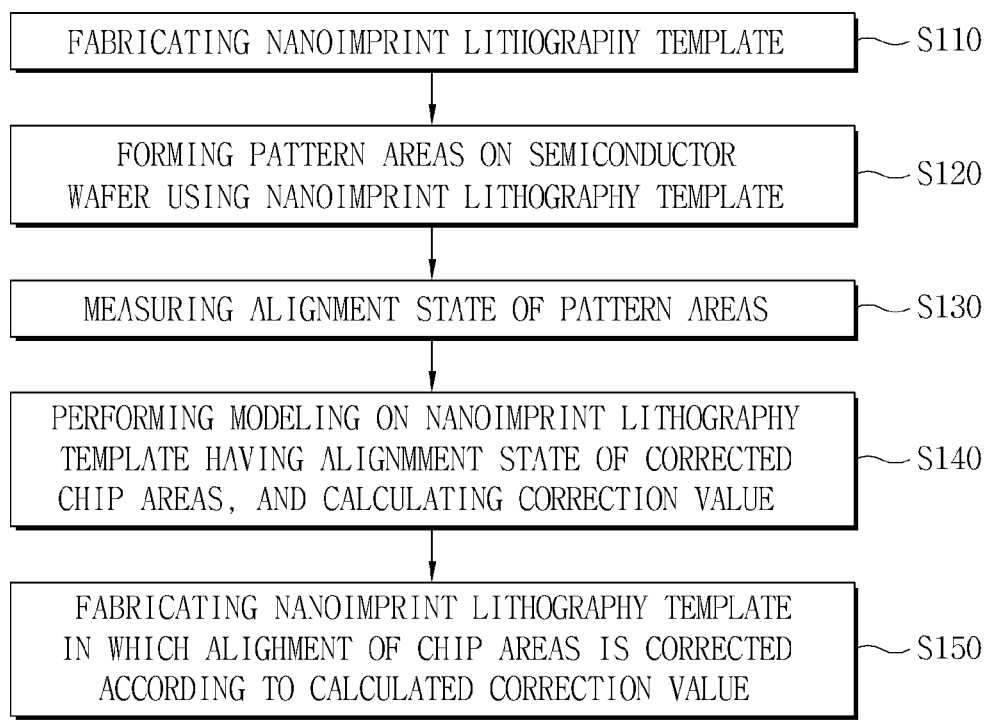
FIGS. 11A and 11B are flowcharts illustrating one embodiment of a method of fabricating a corrected nanoimprint lithography template according to the inventive concept.
Figure 11B:
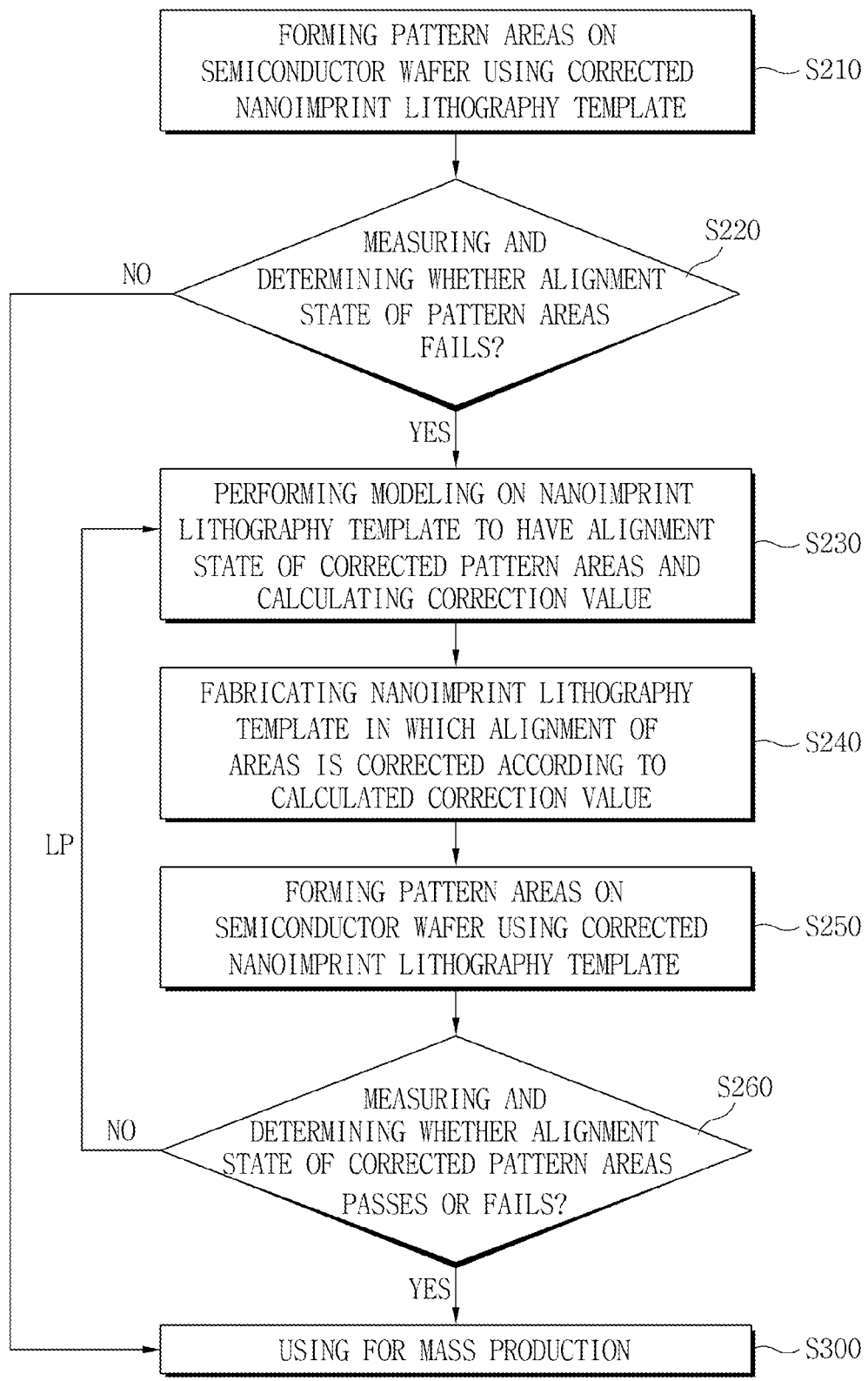

FIGS. 11A and 11B are flowcharts illustrating a method of fabricating a corrected nanoimprint lithography template according to the inventive concept.

Referring to FIG. 11A, the method of fabricating a corrected nanoimprint lithography template 300 according to the inventive concept includes fabricating a nanoimprint lithography template 300 according to any of the examples of the method described with reference to FIGS. 1, 2 and 3A-3E (S110).

Next, a pattern is formed on the semiconductor wafer 400 using the nanoimprint lithography template 300 according to any of the examples of the method described with reference to FIGS. 4A-4F (S120). Thus, pattern areas PA on the semiconductor wafer 400 may be constituted by the polymer pattern 455 or the material pattern 445. In any case, the pattern areas PA formed on the semiconductor wafer 400 as a result may have any of the states illustrated in FIGS. 5A to 5D.

Subsequently, the bias (or "alignment state" as referred to in the figure) of the pattern areas PA on the semiconductor wafer 400 is determined (S130), e.g., is measured, quantified and mapped. When the pattern areas PA on the semiconductor wafer 400 have the alignment state illustrated in FIG. 5A, the nanoimprint lithography template 300 is determined to be normal. In this case, it may be used in a mass production process of forming patterns on semiconductor wafers.

If, on the other hand, the pattern areas PA on the semiconductor wafer 400 exhibit one of the biases illustrated in FIGS. 5B to 5D, for example, a corrected nanoimprint lithography template 300 having chip areas CA, of a type shown in FIGS. 10A to 10C, for example, is modeled, and a correction value representative of the model of the corrected nanoimprint lithography template 300 is calculated or the like (S140). The correction value is indicative of whether the nanoimprint lithography template 300 requires correction in an X-direction, Y-direction or both the X and Y-directions according to the required correction value of the reticle stage 130 or 230 or template stage 270, and may represent an inclination of a component(s) of the scanning exposure equipment 100 or 200 necessary to effect such a correction.

Next, a (corrected) nanoimprint lithography template 300 is fabricated according to the correction value (S150). That is, a component (s) of the scanning exposure equipment 100 or 200 is inclined, as shown in and described with respect to any of 8A to 9B, according to the correction value, and the corrected nanoimprint lithography template 300 is fabricated by an exposure process as shown in and described with respect to any of 8A to 9B and the associated steps described with reference to FIGS. 3B-3E. As a result, a corrected nanoimprint lithography template 300 of the type illustrated in any of FIGS. 10A to 10C is fabricated.

Referring now to FIG. 11B, pattern areas PA are formed on a semiconductor wafer, in the manner described with reference to FIGS. 4A to 4F, using the corrected nanoimprint lithography template 300 (S210).

Subsequently, the pattern areas PA formed on the semiconductor wafer 400 using the corrected nanoimprint lithography template 300 are characterized (e.g., measured) to determine bias in the pattern areas PA, and a determination is made as to whether the alignment state represented by the bias passes some set criteria (S220). For example, if the alignment state of the pattern areas PA on the semiconductor wafer 400 meets the criteria, i.e., if the wafer 400 passes, the corrected nanoimprint lithography template 300 is then designated for use in a mass production process (S300). On the other hand, if the alignment state of the pattern areas PA on the semiconductor wafer 400 does not meet the criteria, i.e., if the wafer 400 fails, a process similar to that of step (S140) is performed to calculate a new correction value (S230).

Then, a new corrected nanoimprint lithography template 300 is fabricated using the new correction value in the same type of method used in step (S150) to form the first corrected nanoimprint lithography template 300 (S240).

Next, pattern areas PA are once again formed on a semiconductor wafer 400 but this time using the new corrected nanoimprint lithography template 300 (S250).

Subsequently, the pattern areas PA formed on the semiconductor wafer 400 using the new corrected nanoimprint lithography template 300 are characterized (e.g., measured) to determine bias in the pattern areas PA, and a determination is made as to whether the alignment state represented by the bias passes some set criteria (S260). That is, like step (S220) described above, if the alignment state of the pattern areas PA on the semiconductor wafer 400 meets the criteria, i.e., if the wafer 400 passes, the new corrected nanoimprint lithography template 300 is then designated for use in a mass production process (S300). On the other hand, if the alignment state of the pattern areas PA on the semiconductor wafer 400 does not meet the criteria, i.e., if the wafer 400 fails, a process similar to that of (S140) is performed to calculate a new correction value (S230). That is, the method may comprise an iteration using a correction loop (LP).

As described above, according to an aspect of the inventive concept, a nanoimprint lithography template that is at least the same size as a semiconductor wafer can be provided. According to another aspect of the inventive concept, all of the pattern areas on a semiconductor wafer may be formed by a single imprint process. Therefore, the inventive concept may be applied to increase throughput and enhance productivity in a process of fabricating a semiconductor device. Still further, methods of fabricating a nanoimprint lithography template according to the inventive concept, provide a control of scanning lithography equipment that allows for the pattern areas of the template to be formed elaborately, and thereby compensate for any process characteristics that would otherwise tend to detract from the uniformity of the pattern areas and create a deviation in their layout from the desired layout (i.e., create a bias). In this respect, also, no separate correction layout is required for producing a corrected nanoimprint lithography template. Therefore, a process of fabricating a corrected nanoimprint lithography template according to the inventive concept is highly efficient which again, translates into increased throughput and enhanced productivity in a process of fabricating a semiconductor device.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a nanoimprint lithography template, comprising:
fabricating a first nanoimprint lithography template having a plurality of chip areas;
forming a plurality of pattern areas corresponding to the plurality of chip areas on a semiconductor wafer using the first nanoimprint lithography template;
determining a deviation of a layout of the pattern areas from a desired layout of the pattern area; and
fabricating a second nanoimprint lithography template that corrects the deviation, wherein fabricating the second nanoimprint lithography template that corrects the deviation comprises:
installing a reticle on a reticle stage of scanning lithography equipment having a light source, the reticle stage, and a template stage;
mounting a template substrate on the template stage; and
exposing regions on the template substrate with light emitted by the light source in a scanning process performed by the scanning lithography equipment, characterized in that at least one part of the scanning lithography equipment is inclined such that a line passing through a center of light exposing each of the regions, respectively, in a first direction in which the light propagates towards the template substrate is incident on the exposure region at an oblique angle.

2. The method of claim 1, wherein the scanning process includes passing the light through an elongated slit interposed between the reticle and the template substrate with respect to an optical axis of the equipment extending in said direction in which the light propagates towards the template substrate.

3. The method of claim 2, wherein the scanning process includes moving the reticle stage and the template stage in a second direction perpendicular to the first direction in which the slit is elongated.

4. The method of claim 3, wherein the scanning process is characterized in that the reticle stage is inclined relative to the template substrate.

5. The method of claim 3, wherein the scanning process includes moving the template stage to be inclined.

6. The method of claim 1, wherein the scanning process comprises tilting the reticle stage.

7. The method of claim 1, wherein the scanning process comprises raising or lowering a part of the reticle stage to tilt the reticle.

8. The method of claim 1, wherein the scanning process comprising tilting the template stage.

9. The method of claim 1, wherein the second nanoimprint lithography template has a second plurality of chip areas each including a plurality of the exposure regions, and all of the second plurality of chip areas are exposed during said scanning process.

10. The method of claim 1, wherein a size of the second nanoimprint lithography template is at least as great as that of the semiconductor wafer, and the chip areas occupy an area as great as that of areas of the semiconductor wafer to be patterned.

11. The method of claim 1, wherein forming the plurality of pattern areas on the semiconductor wafer includes:
 forming a target layer and a polymer layer on the semiconductor wafer;
 imprinting a pattern of the chip areas of the first nanoimprint lithography template all at once in the polymer layer, and forming a polymer pattern corresponding to the plurality of chip areas;
 patterning the target layer using the polymer pattern as an etch mask; and
 removing the polymer pattern.

12. The method of claim 1, wherein determining the deviation comprises measuring a bias of the pattern areas.

13. The method of claim 12, wherein fabricating the second nanoimprint lithography template that corrects the deviation includes calculating the oblique angle based on said deviation.

14. The method of claim 1, wherein fabricating the second nanoimprint lithography template that corrects the deviation includes calculating the oblique angle based on said deviation.

15. The method of claim 1, wherein fabricating the first nanoimprint lithography template having a plurality of chip areas comprises scanning regions of a substrate corresponding to the chip areas, respectively, sequentially each by a single independent scanning process.

* * * * *